United States Patent [19]
DiGiulio

[11] Patent Number: 5,438,519
[45] Date of Patent: Aug. 1, 1995

[54] ELECTRONIC POSTAGE METER HAVING MEMORY WRITE ACCESS SECOND CHANCE HARD TIMER MEANS

[75] Inventor: Peter C. DiGiulio, Fairfield, Conn.

[73] Assignee: Pitney Bowes Inc., Stamford, Conn.

[21] Appl. No.: 989,673

[22] Filed: Feb. 10, 1993

[51] Int. Cl.[6] .......................................... G06F 15/20
[52] U.S. Cl. .................... 364/464.02; 371/62; 364/915.52; 395/550
[58] Field of Search ............... 371/12, 7, 10.1, 21.1, 371/16.3, 16.4, 61, 62, 68.3; 395/575, 725, 375, 550; 364/941.5, 960.4, 464.02, 921.8, 934, 918.52, 950, 950.4

[56] References Cited

U.S. PATENT DOCUMENTS

| | | | |
|---|---|---|---|
| 4,584,647 | 4/1986 | Eckert | 364/464 |
| 4,701,856 | 10/1987 | DiGiulio et al. | 364/464.02 |
| 4,710,882 | 12/1987 | DiGiulio et al. | 364/464 |
| 4,742,469 | 5/1988 | Haines et al. | 364/466 |
| 4,837,702 | 6/1989 | Obrea | 364/466 |
| 4,998,203 | 3/1991 | DiGiulio et al. | 364/464.02 |
| 5,260,900 | 11/1993 | Muller | 365/189.01 |

Primary Examiner—Beausoliel, Jr. Robert W.
Assistant Examiner—Dieu-Minh Le
Attorney, Agent, or Firm—Charles G. Parks, Jr.; Melvin J. Scolnick

[57] ABSTRACT

A postage meter control system includes a microcomputer having a programmable microprocessor. The microcomputer is in communication with a decoder integrated circuit (Decoder IC). The Decoder IC has a first write control flip-flop and a second write control flip-flop, as in the preferred embodiment there are redundant non-volatile memories. Each control flip-flop has an output to a respective AND gate. The Decoder IC includes a dual timer which has an output to the control flip-flops. As a result, when the microcomputer enters write routine, the timer releases the control flip-flops to allow the system to be write enabled. If the write routine encounters a error, resulting in the timer timing out, the timer resets the control flip-flop and communicates with the microcomputer to try a retry. A more detailed description, and other features and advantages will become apparent in conjunction with the detailed description of the preferred embodiment.

1 Claim, 22 Drawing Sheets

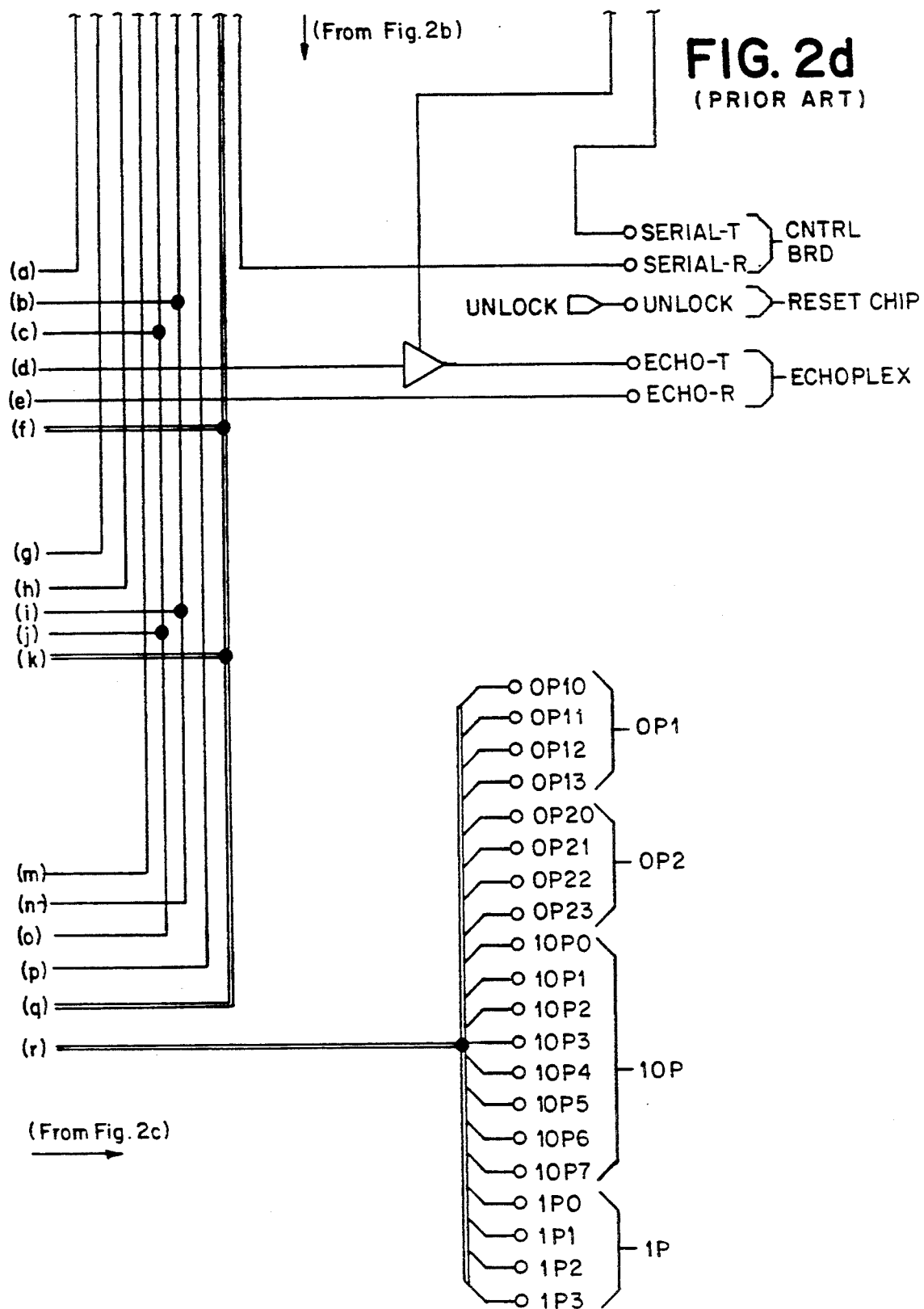

ELECTRONIC POSTAGE METER HAVING MEMORY WRITE ACCESS SECOND CHANCE HARD TIMER MEANS

BACKGROUND OF THE INVENTION

The invention relates to postage meters, and in particular, to electronic postage meters having microcomputer control of printing and accounting functions.

Devices of this type are generally known, and are discussed for example in U.S. Pat. No. 3,978,457. This patent discloses a system for a postage meter which includes a keyboard for the manual introduction of data corresponding to the postage to be printed in a Random Access Memory for real time operation. Data is stored in a nonvolatile memory upon power down and read into the Random Access Memory upon power up.

U.S. Pat. No. 4,481,604 describes an electronic postage meter having a redundant memory system in which for each postal printing operation, identical data is stored, respectively, in two separate, but identical CMOS battery backed non-volatile memories.

In these known devices, there have been found to be times when essential data has not properly been stored in the non-volatile memory of the meter. It has been found that one reason might be the improper selection of access to a particular device.

In known electronic postage meters, the microprocessor high order address bits or combination thereof are utilized in a standard decoder for selecting or enabling a particular memory or peripheral device to be accessed in accordance with the microcomputer instructions. While this normally works well, in many cases of improper operation of the microcomputer or failure of one of the address lines of the bus, an improper bit may be decoded and the select logic gate which then enables the wrong device may cause wrong data to be read from memory or in the worst case cause data to be written into an unknown memory or peripheral with no indication of any malfunction. When this happens there is a strong possibility of service personnel not being able to recover essential information from the non-volatile memory in the postage meter when the postage meter fails. In U.S. Pat. No. 4,901,273, in order to assure that data is written only to the appropriate non-volatile memory, a logic circuit has been provided which will decode the addresses called by the microprocessor in such manner as to ensure the selection of the appropriate memory or device, and particularly the NVM, only when the addresses, appropriate to that device, are communicated.

U.S. Pat. No. 4,998,203 describes a memory protection circuit which, among other things, locks the NVM during a write-cycle should the NVM remain write enabled for too long, approximately 16 clock cycles, which indicates a high order fault condition.

It has been found that to further protect the NVM, memory protection can be further enhanced by time controlling the control flip-flops of the decoder system described in U.S. Pat. No. 4,901,273. That is, during the write cycle of the system microcontroller, a non-fatal software error may occur, wherein a decoder timer unlocks the control flip-flop at the beginning of the write cycle and relocks the control flip-flops after a specified amount of time to allow the microcontroller to overcome the soft error condition, such as by a retry. In contrast to the hard fault timer, the system is not locked.

SUMMARY OF THE INVENTION

It is accordingly a first object of the invention to provide a decoder having a control gate responsive to write enable from a microcomputer and a timing means for controlling the write enable of the control gates such that the write enable of the control gate is timed wherein should the write enable signal from the microcomputer remain active too long the control gate is locked and the microcomputer is reset to try a retry of the write routine.

The postage meter control system includes a microcomputer having a programmable microprocessor. The microcomputer is in communication with a decoder integrated circuit (Decoder IC). The Decoder IC has a first write control flip-flop and a second write control flip-flop, as in the preferred embodiment there are redundant NVMs. Each control flip-flop has a output to a respective AND gate. The Decoder IC includes a dual timer which has an output to the control flip-flops. As a result, when the microcomputer enters write routine, the timer releases the control flip-flops to allow the system to be write enabled. If the write routine encounters an error, resulting in the timer timing out, the timer resets the control flip-flop and communicates with the microcomputer to try a retry. A more detailed description, and other features and advantages will become apparent in conjunction with the detailed description of the preferred embodiment.

Alternatively, in this case, a conventional software timer may be employed. When a software timer is employed, as the software enters a write routine, line ST goes active releasing the flip-flops 1 and 2, for the write procedure as afore described. If the write procedure is not completed within the allotted software time, the software causes line ST to go active resetting the flip-flops and causing the software to enter a retry.

BRIEF DESCRIPTION OF THE DRAWINGS

FIGS. 2(a)–2(d) are is a block diagram of a specific arrangement of a processor interface circuit in accordance with the invention;

DETAILED DESCRIPTION OF THE PREFERRED EMBODIMENT

Figure 1A:
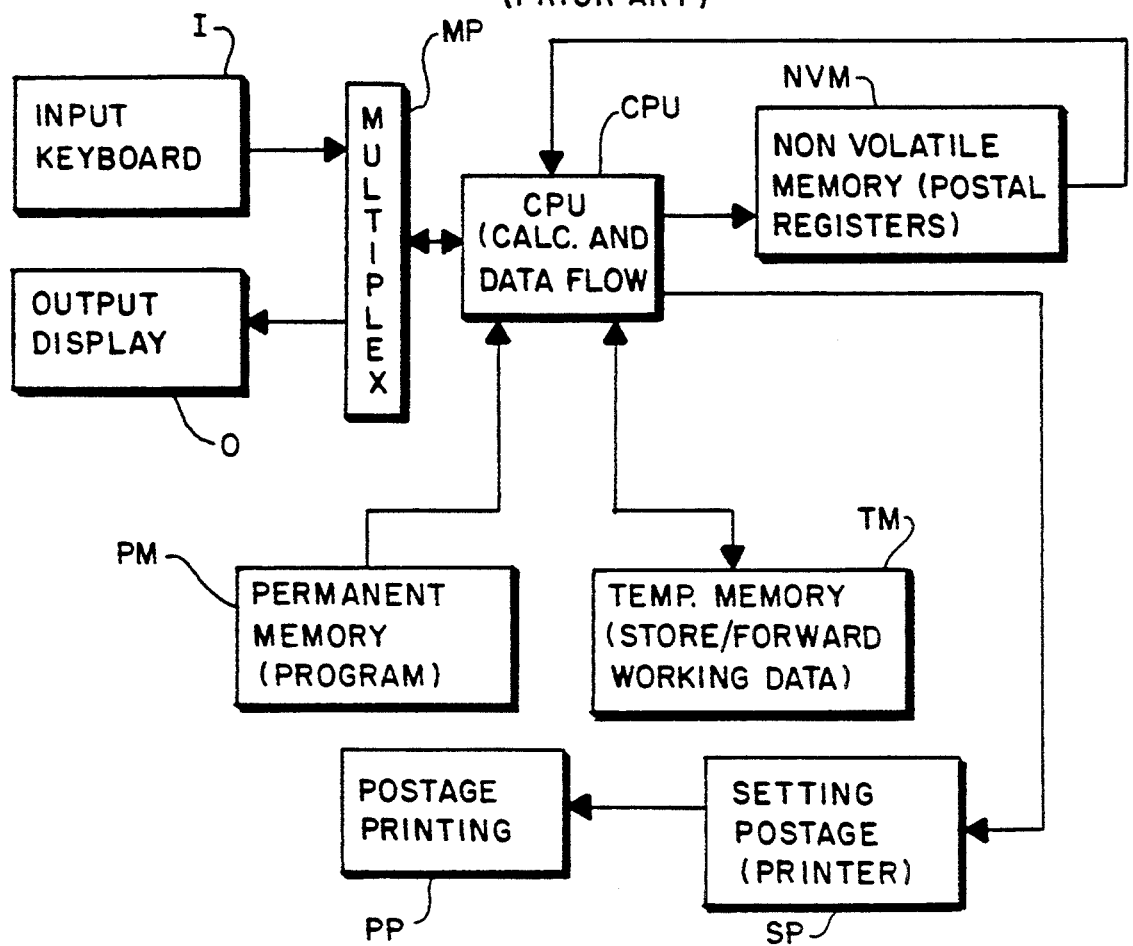
FIG. 1A is a block diagram of an electronic postage meter in accordance with the invention.

Referring now to FIG. 1A which is a block diagram of a meter in which the invention may be incorporated. Such meters are known and are described for instance in U.S. Pat. No. 3,978,457 to Check et al. and assigned to the assignee of the present invention, specifically incorporated herein by reference. In this referenced patent, the working memory under control of the CPU is a Random Access Memory from which data must be transferred to a non-volatile memory upon loss or shutdown of power to the meter.

U.S. Pat. No. 4,481,604 assigned to Roneo Alcatel discloses an electronic postage meter where the Random Access Memory and the non-volatile storage memories are combined in battery backed CMOS RAMs which are used both for the real time operation and for long term storage of information in postal registers. EPC Application No. 0 085 385 published Aug. 10, 1983, and assigned to the assignee of the present invention discloses an improved dual non-memory system and is specifically incorporated by reference. It will be appreciated by those skilled in the art that such a device may be combined with the electronic postage meter described in Check et al. and is also suitable for the invention disclosed herein. The decoder arrangement disclosed herein is conveniently used to provide a method and apparatus for further protecting essential postal data in conjunction with the circuit described in U.S. Pat. No. 4,998,203, entitled POSTAGE METER WITH NONVOLATILE MEMORY PROTECTION and assigned to the assignee of the present invention.

Still referring to FIG. 1, the heart of the general functional arrangement of the system is the CPU which is utilized with specific instructions programmed in the Read Only Memory (PM), for the performance of control of the basic meter functions, for the performance of calculations based on any input data and for controlling the flow of data into the various memories.

The system may operate in accordance with data applied from an appropriate input means "I" or from a communications means "C" such as described for instance in U.S. Pat. No. 4,301,507 to Soderberg also specifically incorporated herein by reference. The data is fed into the CPU under control of the program in Read Only Memory and at any time during the operation of the system, should the contents of the memory storing the appropriate credit/debit balances or other cumulations in accordance with various features of the system be desired to be displayed, appropriate instructions provided by the input means "I" cause the CPU to access the desired locations in memory which store the information requested. The information may be displayed on an output unit "O". As well known, the input and output units may be multiplexed by a suitable multiplex unit "MP" for transferring data to and from the CPU.

Figure 1B:
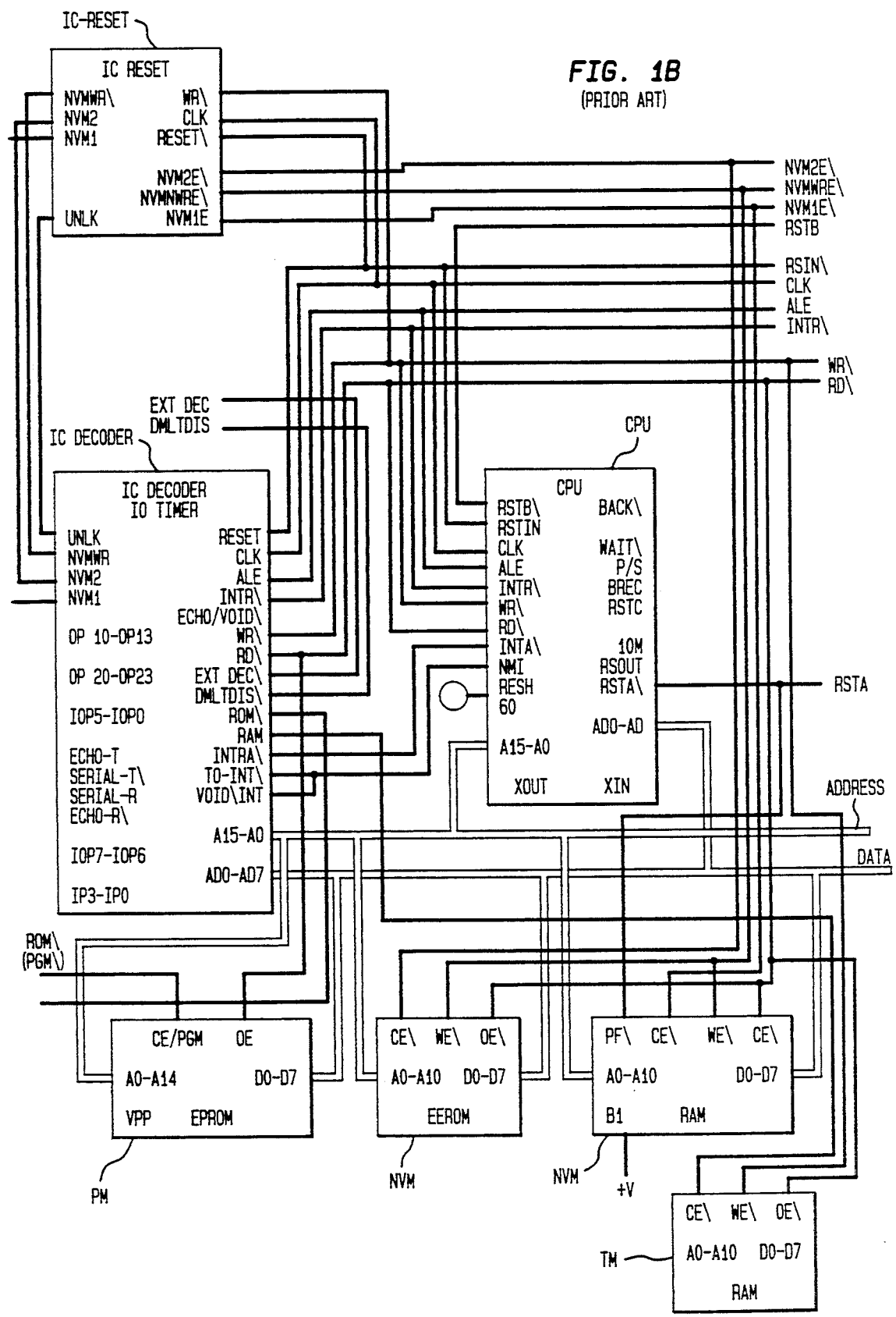
FIG. 1B is a schematic of the microcomputer of the electronic postage in accordance with the invention.

Referring to FIG. 1B, the specific arrangement of a processor along with the processor interface circuit on a board level in accordance with the present invention includes a integrated circuit decoder board, IC Decoder, and a integrated circuit reset board, IC Reset. FIG. 2 is a block diagram of a specific arrangement of a IC Decoder processor interface circuit in accordance with the invention and comprises an address decoder and associated selection circuitry for the selection and control of various elements of the Electronic Postage Meter. It will be appreciated that the circuit arrangement herein described is preferably embodied in a custom LSI microchip, however, it will be understood that the use of conventional logic components is also contemplated.

The overall block diagram of the circuit is shown generally at 10. The demultiplexer 12, in conventional manner, demultiplexes the address/data bus 14 of a microprocessor (not shown in FIG. 2), suitably an 8085 series microprocessor available from the Intel Corporation or an NSC800 Series microprocessor available from the National Semiconductor Corporation. The bus 14 communicates with the demultiplexer 12 on communication lines 16 through a conventional transceiver circuit arrangement 18. For best results the ADDRESS LATCH ENABLE (ALE) signal 20 from the microprocessor is "anded" with the microprocessor read strobe signal 22 to provide the latching signal for latching the address information for the demultiplexer 12.

The demultiplexed address information is fed out on lines 24 for use in other parts of the EPM and are internally connected at 26 to the decoder section 28. The high order address signals directly from the microprocessor are communicated on lines 30 to the decoder section 26. An external decode signal, EXTDEC \, is also input to the decoder section 28.

The decoder section 28 receives and decodes a complete input address received at 26 and 30 to provide select outputs for the various parts of the system. The low order demultiplexed address lines A0, A and A2 are utilized as inputs to control flip-flops 32 along with the microprocessor write strobe WR \ received at 34 from the microprocessor. As described further below, the control flip-flop section generates four control signals in response to these inputs in addition to a decoder reset signal and other derived signals, i.e., EXT-INTP, a pulse signal generated at the activation of the illegal memory access output pin, and a select signal CONTRL-s for the selection of the Control Flip-Flop block.

Outputs from the decoder 28 are provided to NVM output control block 36. This control block 36, in accordance with the invention, provides a fail-safe NVM device selection. The selection of either NVM is disabled if the NVM write line is shorted to the "active" state. The NVM write strobe is disabled whenever the other devices are selected or in the event that both NVMs are simultaneously selected.

In accordance with the invention, an illegal address control block 38, in conjunction with the decoder 28 detects when the microprocessor read or write strobes attempt to access an illegal, i.e. unused, memory space and, as discussed below, provides a signal output for interrupting the processor.

Status and control block 40 monitors the outputs from the control Flip-Flop section and provides a control port to generate a decoder reset and to control the selection of an internal or external communication through an "Echoplex" I/O section 42. Preferably, the section also includes an 8-bit timer to set the Transmit Baud rate for the serial communications.

Dual Timer section 44 provides two programmable 16-bit timers. Preferably, the system clock is the clock input to the timers. Suitably, each is programmable for continuous or for one-shot operation for generating an interrupt when the programmed count is completed. Conveniently, an 8-bit counter divider can be selected to prescale the clock input or the ripple output of the first timer may be selected as the clock input to the second timer.

Conveniently, serial I/O block 46 and parallel I/O block 48 are utilized for communication with a keyboard and display and for motor control, sensing postal value and miscellaneous control functions.

For best results, an Interrupt Status and Control Block 50 is provided along with an interrupt mask control port for enabling selected interrupts to interrupt the systems processor.

Figure 3A:
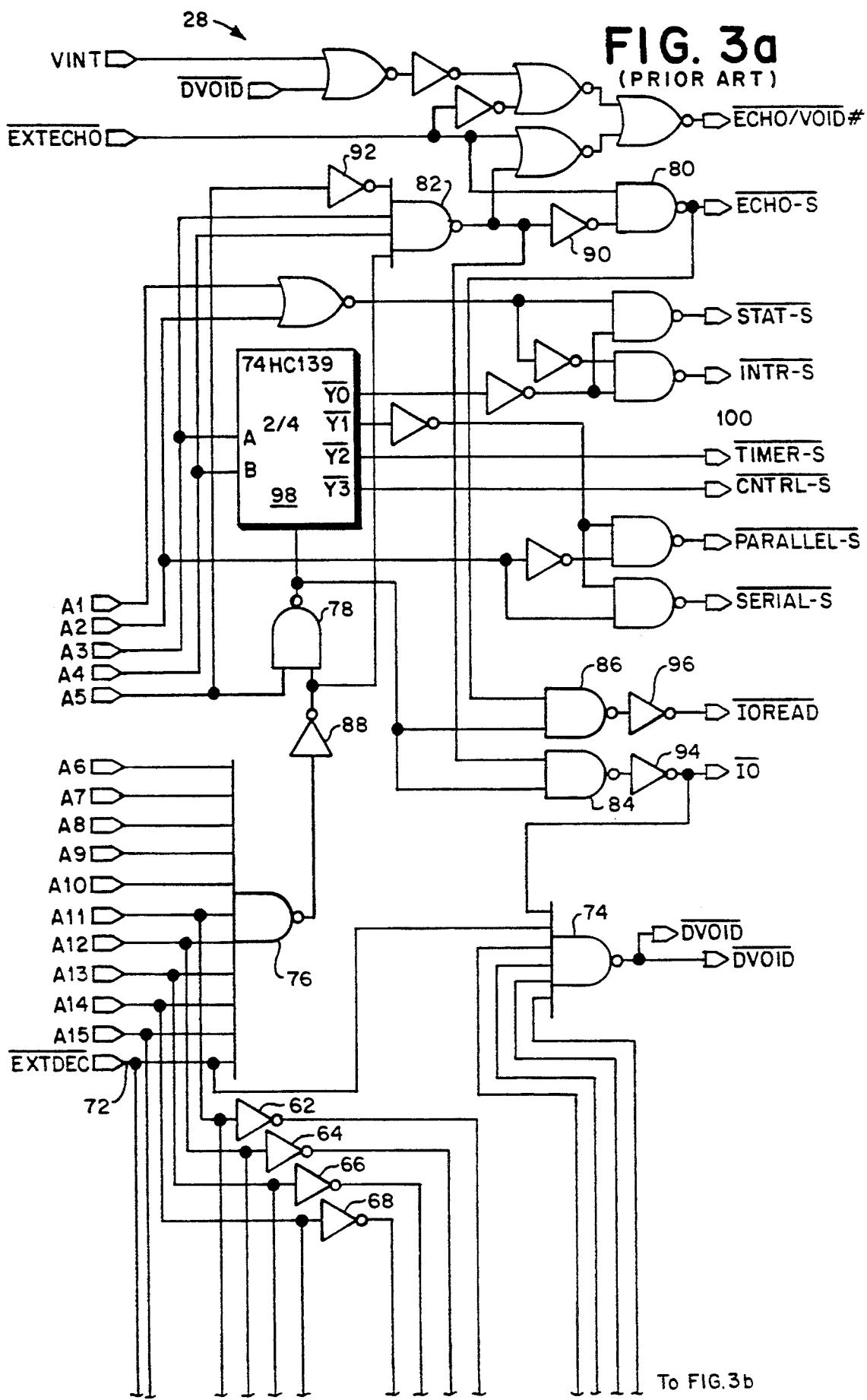
FIGS. 3(a)–3(b) are schematics of a decoder arrangement in accordance with the invention.
Figure 3B:
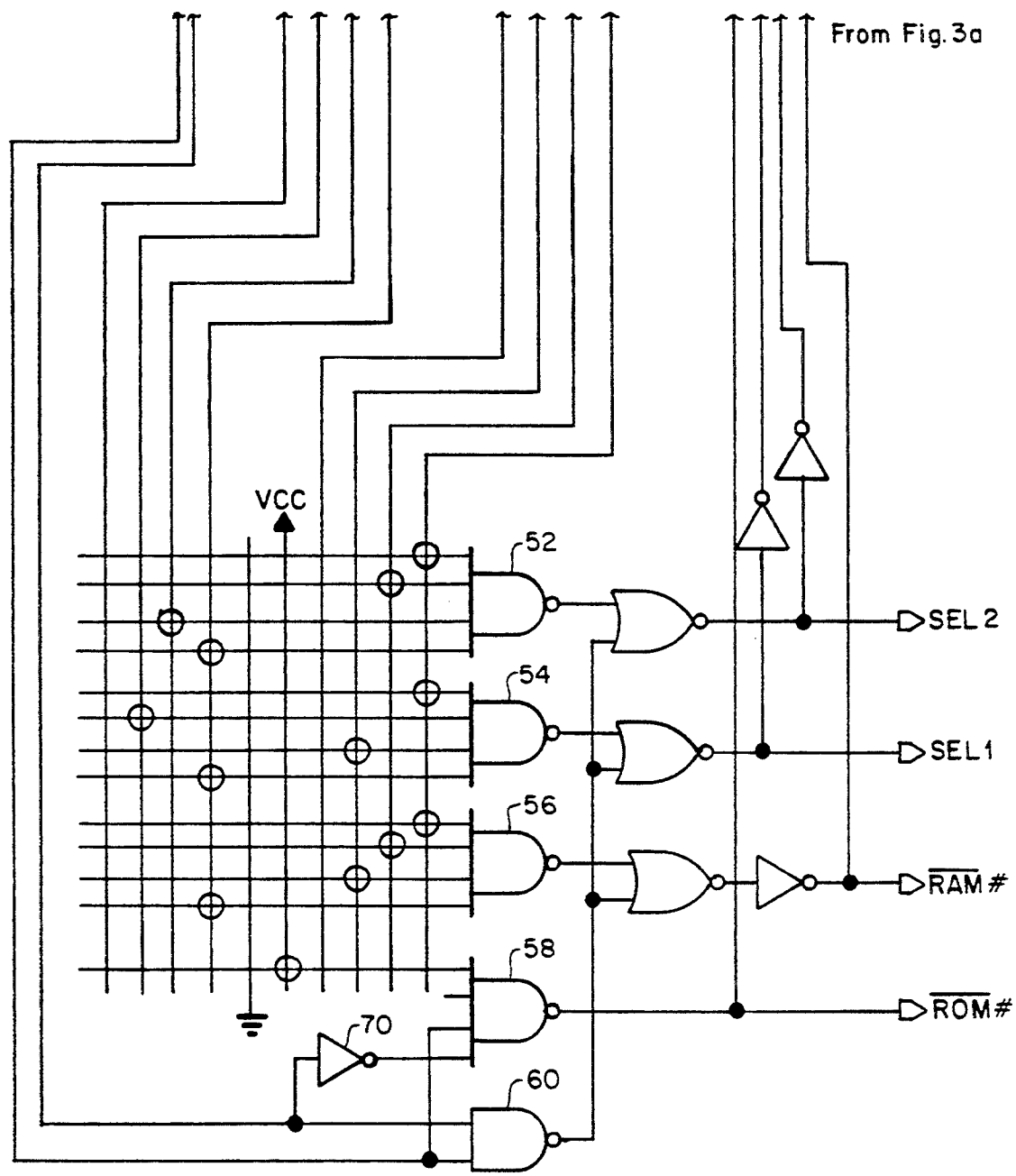

FIGS. 3(a)-3(b) show schematics of an embodiment of a decoder block or providing a decoded memory map in accordance with the invention. The crossed lines with a circle superposed are used to indicate the preferred conductive path in a customized chip arrangement. It will be appreciated that the illustrated arrangement is extremely convenient in that the decoded memory map as described below may be modified easily with only a few mask changes.

Figure 4:
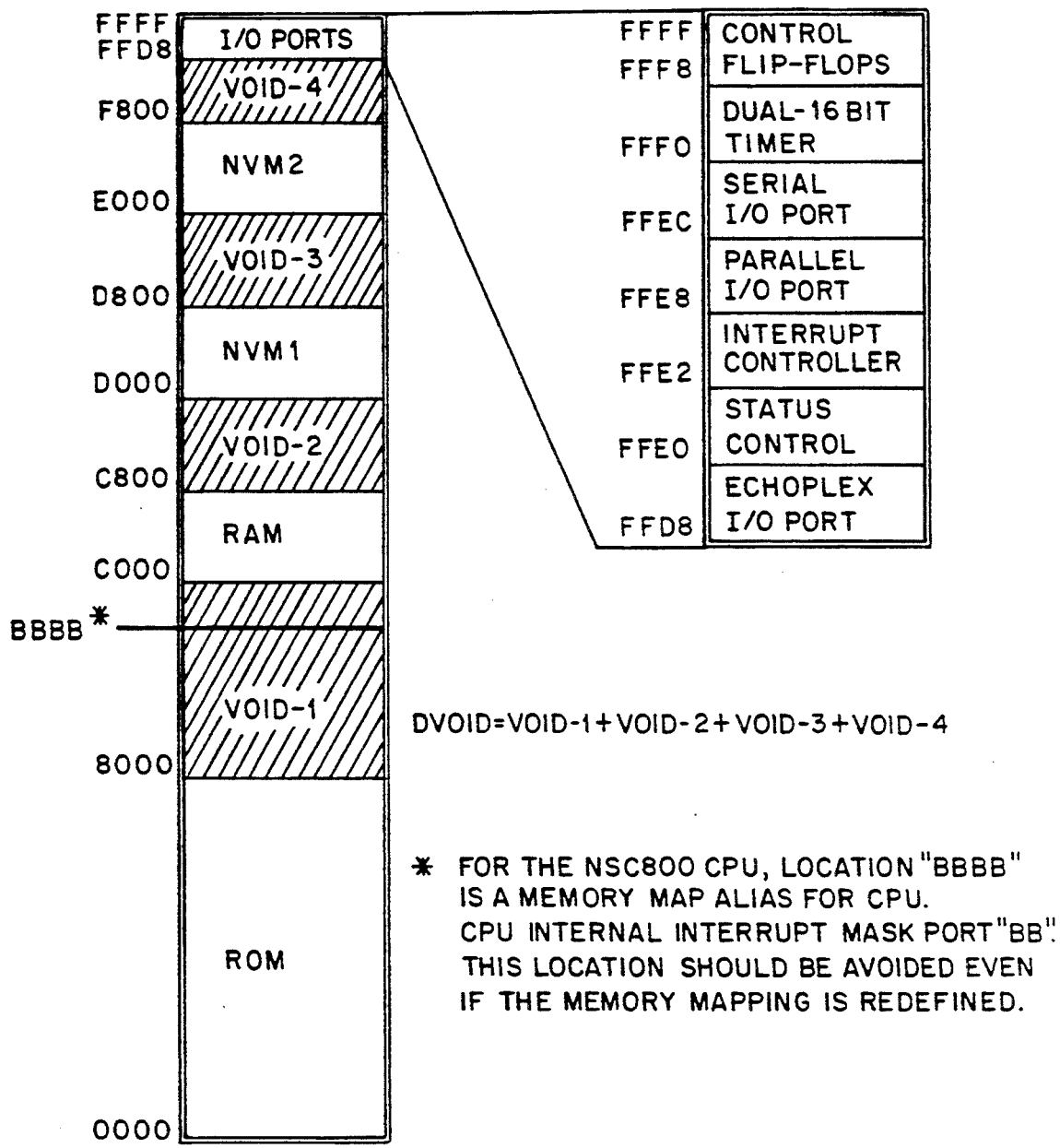
FIG. 4 is a default memory map showing a preferred arrangement of memory locations in accordance with the invention.

The various addresses communicated in known manner from the microprocessor and demultiplexer as described previously are each fed to leads A1 through A15 of the decoder block 28. The address bits on address lines A11 through A15 are supplied to NAND gates 52, 54, 56, 58, and 60 and inverted at inverters 62, 64, 66, 68, and 70 and applied as illustrated to the NAND gates 52, 54, 56, and 58. An external decode signal 72 (see also FIG. 2) is applied to NAND gate 60. The output of NAND gate 60 is NOR'D with the outputs of gates 52, 54, and 56. The EXTDEC signal is also applied directed to gate 58. It will be noted that when "active" this signal will disable the decode function. The decoded outputs from the connections illustrated in FIG. 3(a) for the preferred embodiment are as shown in Table I and in FIG. 4.

It will be noted that in accordance with the invention, an active DVOID output is provided from NAND gate 74 when none of the system's blocks are selected. It will also be clear to one skilled in the art that the address bits, when appropriately decoded as in the illustrated circuit by NAND gates 76, 78, 80, 82, 84, and 86 and inverters 88, 90, 92, 94, and 96 provide an "active" output IO whenever any of the I/O functions is selected and an "active" I/O read output whenever any of the internal circuit functional blocks are selected. Address bits A3 and A4 are applied to 2-to-4 demultiplexer 98 and decoded with other low order address bits for providing output signals as defined in Table I for selecting the appropriate blocks.

It will be understood that the signal DVOID is not necessarily limited to its previously described function. For instance, in the illustrated embodiment, a signal VINT from the control flip-flop block further described below may be used to convert this DVOID signal to another decode output. This signal shown as "ECHO/-VOID" in FIG. 3(a) is available if the circuits internal ECHOPLEX block 42 is utilized. Alternatively, it will be seen that if an external "echoplex" section is utilized, that is, when the signal "EXTECHO" is "active" the "ECHO/VOID#" output becomes the "select" signal for the external block and the "select" signal for the internal echoplex section, "ECHO-S" is disabled.

Figure 5:
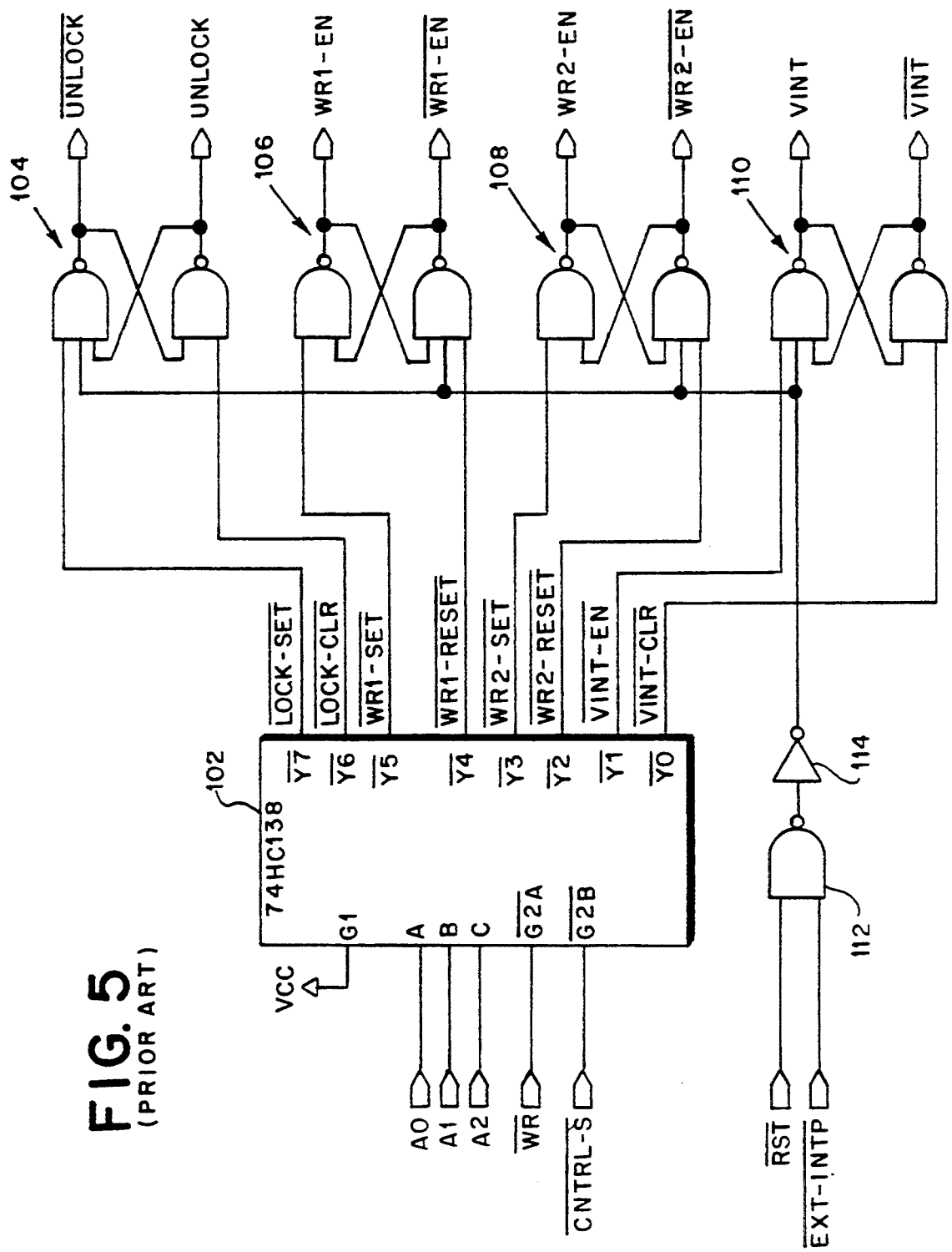
FIG. 5 is an embodiment of a circuit for providing a plurality of control output signals for NVM access.

As mentioned previously, the Control Flip-Flop section 32, more particularly shown in FIG. 5, generates four control output signals and their complements for controlling the generation of an illegal address interrupt signal to the processor, to provide an independent enable/disable for the access to two separate NVM storage devices, to enable and disable meter postage printing and access to non-volatile storage.

TABLE I

| OUTPUTS | |
|---|---|
| ROM# | : SELECT FOR EXTERNAL PROM MEMORY |
| RAM# | : SELECT FOR EXTERNAL RAM MEMORY |
| SEL1 | : FOR GENERATING THE SELECT FOR EXTERNAL NVM#1 |
| SEL2 | : FOR GENERATING THE SELECT FOR EXTERNAL NVM#2 |
| CNTRL-S \ | : SELECT FOR INTERNAL CONTROL FLIP-FLOP BLOCK |
| INTR-S \ | : SELECT FOR INTERNAL INTERRUPT CONTROLLER |
| STAT-S \ | : SELECT FOR INTERNAL STATUS BLOCK |
| TIMER-S \ | : SELECT FOR INTERNAL DUAL-TIMER BL4DCK |
| ECHO-S \ | : SELECT FOR INTERNAL ECHOPLEX BIDCK |
| SERIAL-S \ | : SELECT FOR INTERNAL SERIAL I/O BLOCK |
| PARALLEL-S \ | : SELECT FOR INTERNAL PARALLEL I/O BLOCK |
| ECHO/VOID# \ | : SELECT FOR EXTERNAL ECHOPLEX BLOCK OR SPARE DECODE SIGNAL WHEN UNUSED MEMORY SPACE IS SELECTED (OR NEITHER) |
| IO \ | : ACTIVE WHEN ANY I/O SELECTS ARE ACTIVE |
| IOREAD \ | : ACTIVE WHEN ANY OF THE INTERNAL SELECTS ARE ACTIVE |
| DVOID | : ACTIVE WHEN "ExtDec \ " IS INACTIVE AND WHEN NONE OF THE SELECT OUTPUTS ARE ACTIVE |

| OUTPUT SIGNAL | ADDRESS RANGE(S | SIZE |
|---|---|---|
| ROM# | 0000 - 7FFF | 32 KBYTES |
| RAM# | C000 - C7FF | 2 KBYTES |
| SEL1 | D000 - D7FF | 2 KBYTES |
| SEL2 | E000 - E7FF | 2 KBYTES |
| ECHO-S \ | FFD8 - FFDF | 8 BYTES |
| STAT-S \ | FFE0 - FFE1 | 2 BYTES |
| INTR-S0 | FFE2 - FFE1 | 6 BYTES |
| PARALLEL-S \ | FFE8 - FFEB | 4 BYTES |
| SERIAL-S \ | FFEC - FFEF | 4 BYTES |
| TIMER-S \ | FFF0 - FFF7 | 8 BYTES |
| CNTRL-S \ | FFF8 - FFFF | 8 BYTES |
| IO \ | FFD8 - FFFF | 48 BYTES |
| IOREAD \ | FFD8 - FFFF; IF "EXTECHO \ " INACTIVE FFE0 - FFFF; IF "EXTECHO \ " ACTIVE | |

As best seen in FIG. 5, the low order address signals A0, A1, and A2 are fed to a 3-to-8 Line Decoder Multiplexer 102 equivalent to a 74HC138 available from RCA to set and reset flip-flops 104, 106, 108, and 110. The processor strobe signal WR\ and the select signal CNTRL-S\ are applied to the enable inputs of decoder 102. As illustrated, it is apparent that the control flip-flops are selectively controlled when both these signals are "active".

The decoder reset signal RST\ and EXT-INTP\ (a pulse signal generated at the activation of the illegal memory access interrupt signal) are "NAND'D" at "NAND" gate 112, inverted at inverter and applied to each of the flip-flops 104 and 110. Table II shows the preferred decoded control signals in response to the appropriate addresses.

TABLE II

| A0-2 | DECODED CNTRL | FLIP-FLOP | OUTPUT | |
|---|---|---|---|---|
| 0 | VINT-CLR\ | VINT | INACTIVE | |
| 1 | VINT-EN\ | VINT | ACTIVE | PRESET |
| 2 | WR2-RESET\ | WR2-EN | INACTIVE | PRESET |
| 3 | WR2-SET\ | WR2-EN | ACTIVE | |
| 4 | WR1-RESET\ | WR1-EN | INACTIVE | PRESET |
| 5 | WR1-SET\ | WR1-EN | ACTIVE | |
| 6 | UNLOCK-SET\ | UNLOCK | ACTIVE | |
| 7 | UNLOCK-CLR\ | UNLOCK | INACTIVE | PRESET |

The outputs from flip-flop 104 designated UNLOCK are preferably active to enable postage printing and for NVM access. For best results, the preset value is inactive to prevent printing and NVM access. The signal WR1-EN and WR2-EN are "active" for write access to respective NVM devices #1 and #2. Again, for best results the preset values are "inactive".

The output VINT which as previously discussed is fed to the decoder section 28 is active to enable an interrupt generation whenever an illegal memory access is attempted. It will be appreciated that this is preferred since in the "inactive" state it may be used to reset the generated interrupt signal or to disable the interrupt so that it may be used as a spare decode output. The VINT preset signal is "active" to enable the interrupt.

Figure 6:
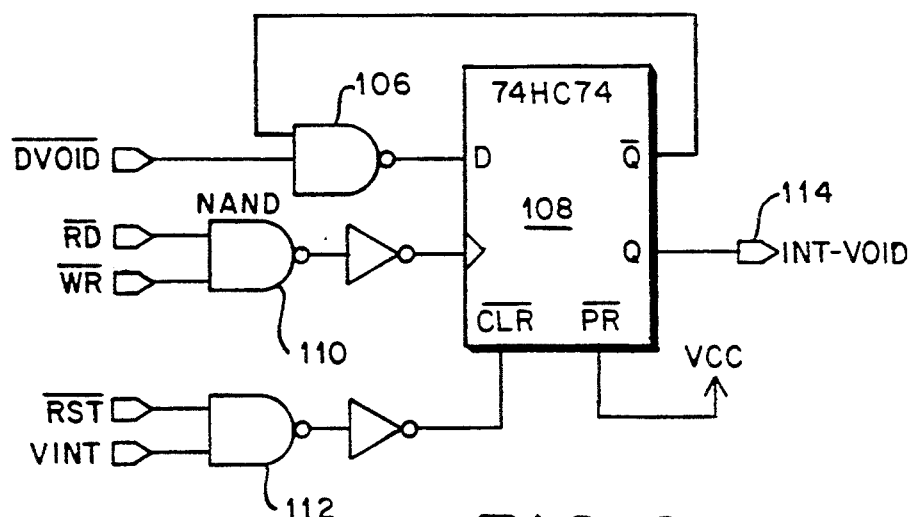
FIG. 6 shows a preferred embodiment for providing a signal in response to an illegal address selection.

The illegal address control block 38 is shown more particularly in FIG. 6. This circuit is used to provide an indication of when access to unused memory space is attempted.

The DVOID\ decoded signal output from the decoder section 28 is nanded at NAND gate 106 with the Q\ output from a D Flip-Flop 198. The processors read strobe RD and write strobe WR\ are NAND'D at NAND gate 110, inverted and applied to the clock input of the D flip-flop 108. The decoder reset signal is NAND'D with the "VINT" signal from the control flip-flop section 32 at NAND gate 112 and applied to the RESET input shown as CLR\ in the Figure.

Thus, depending upon the status of the signal VINT as discussed previously, the decoded void memory space indication will be latched at the lead edge of either the read or the write strobe of the microprocessor to provide the output INT-VOID from the Q terminal of flip-flop 108. In accordance with the invention, the INT-VOID signal is provided to the system microprocessor as an interrupt signal. Preferably, this indication will remain latched until reset by the reset signal from the microprocessor.

Figure 2A:
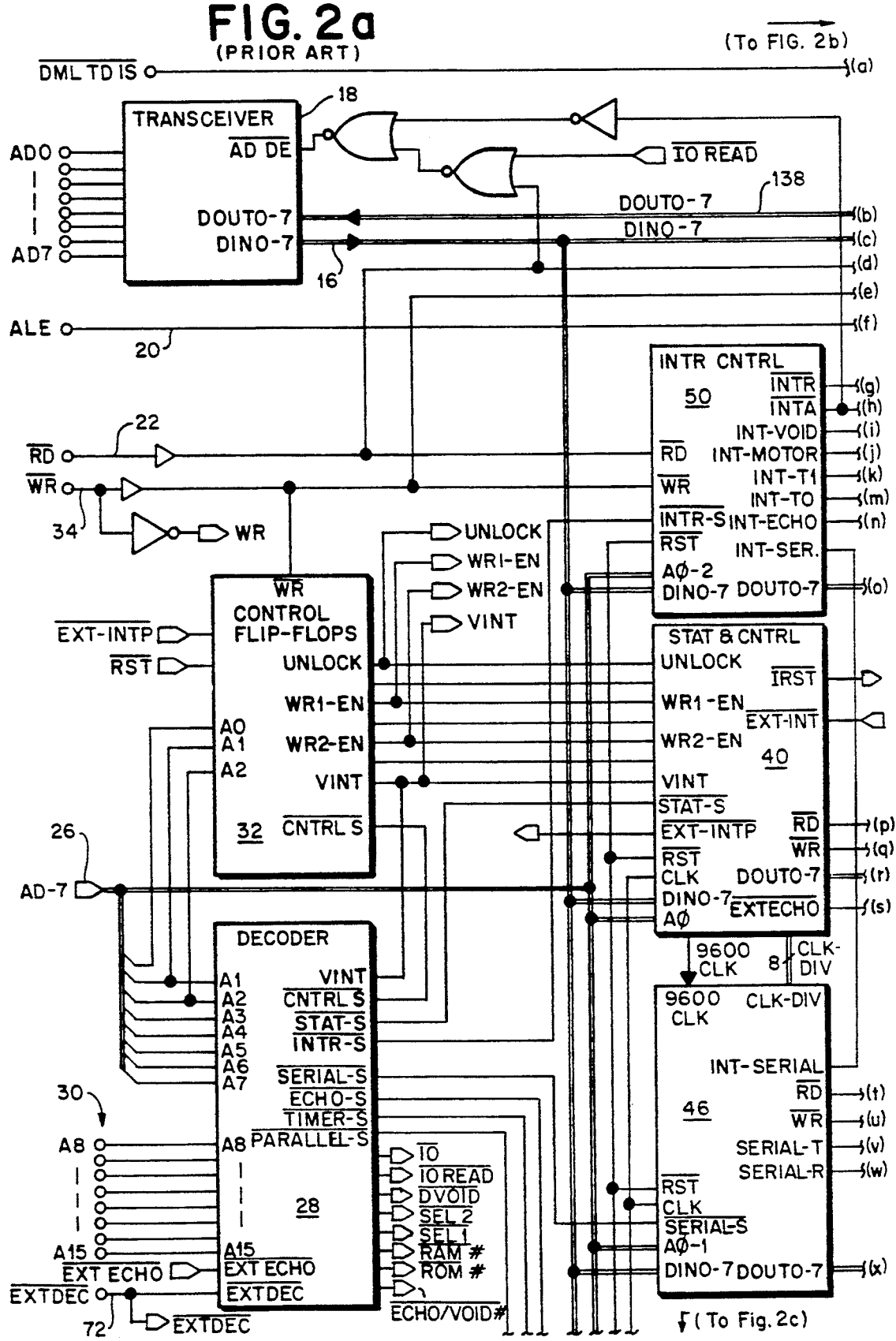
Figure 2B:
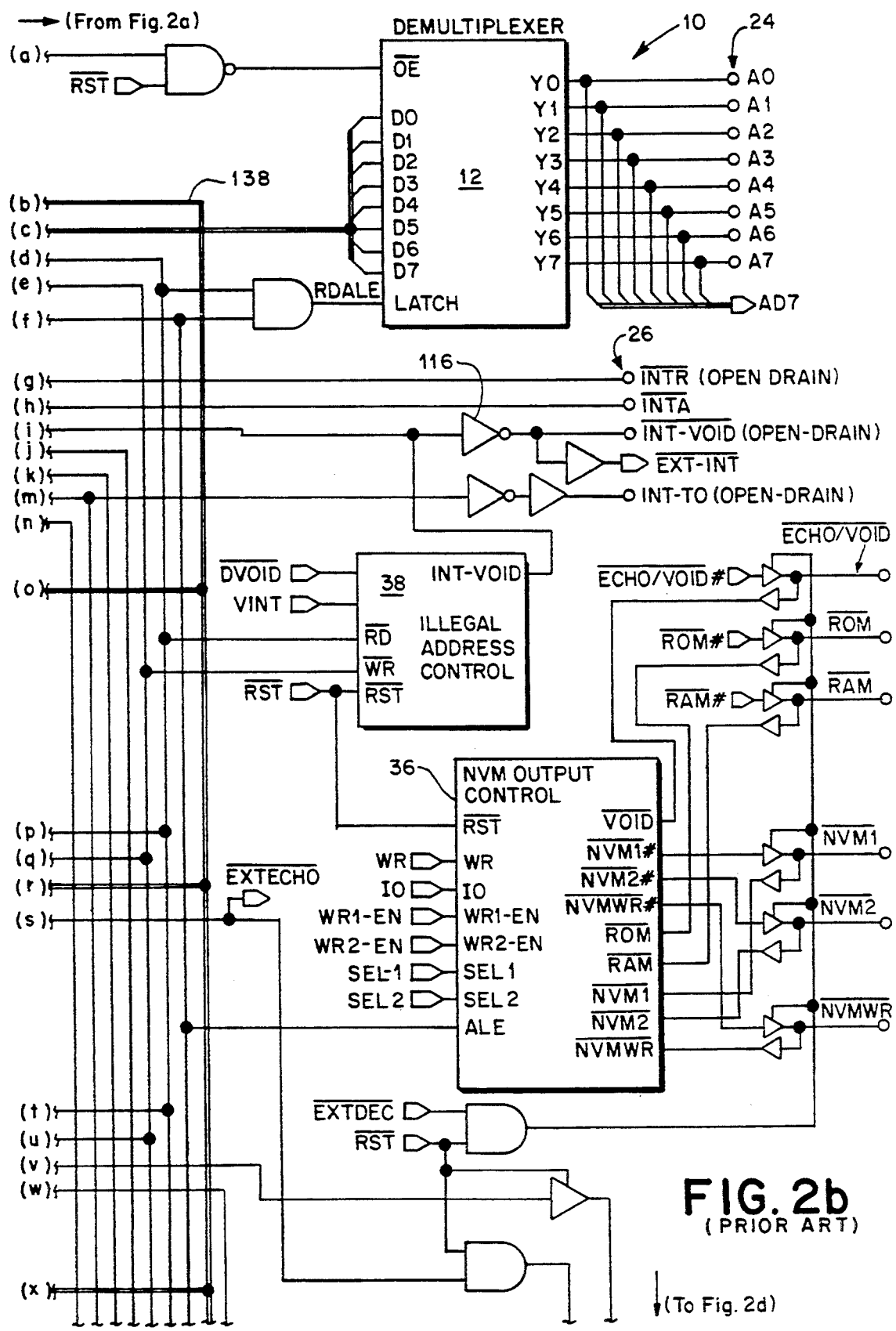
Figure 2C:
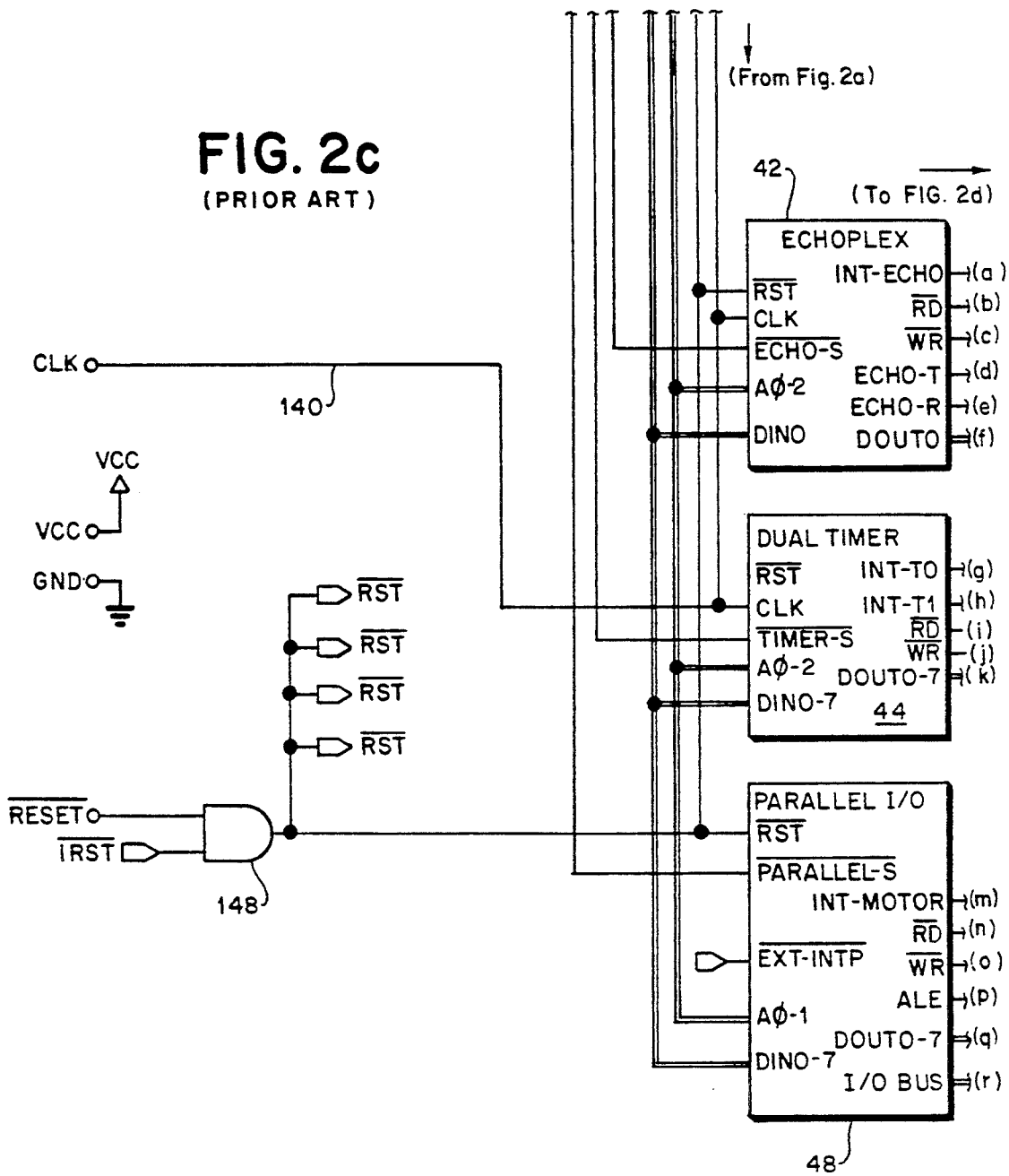

Conveniently, as seen in FIG. 2(a), the output is inverted at inverter 116 and supplied at 118 at INT-VOID.

For best results, this INT-VOID\ output pin in open-drain so as to permit any of a number of open-drain outputs wire-ored to this pin to activate the output signal. This output pin is then suitably tapped as the input signal EXT-INT\ which is furnished to the Status and Control Block. There, this signal is provided as a status port bit and upon its actuation, a 1 clock period pulse is generated on signal EXT-INTP\. This EXT-INTP\ is provided from the status and control section to reset the control flip-flop and parallel I/O sections to their default (safe) states when the INT-VOID\ output pin is activated.

Figure 7:
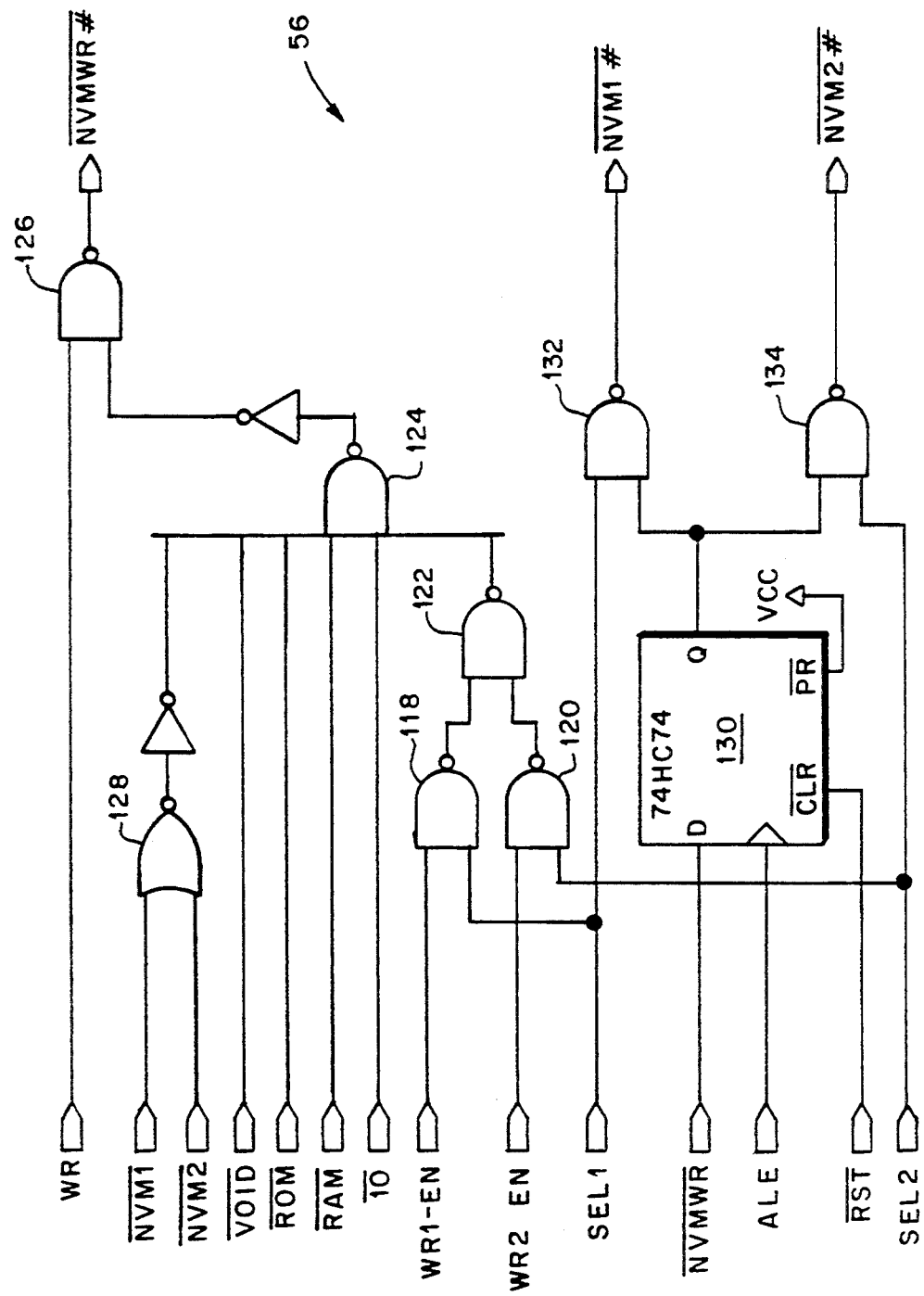
FIG. 7 shows in schematic form a preferred embodiment of a circuit for providing NVM selection.

Turning now the FIG. 7, the NVM Output Control Block 36 is shown in greater detail. In order to insure secure accounting in the NVM, the WRITE access to the two independent NVM devices is independently enabled and disabled under software control.

The NVM OUTPUT CONTROL will block the microprocessor write strobe WR unless either of the NVM decoded select signals SEL1 and SEL2 is available and the appropriate write enable signal from the control flip-flops are available at NAND gates 118 and 120. The output of these gates are inputs to NAND gate 122 whose output is applied to NAND gate 124. The output of this gate is inverted and supplied to NAND gate 126.

The other signals applied to NAND gate 124 are the decoded select signals NVM1, NVM2, ROM, RAM and VOID are taken from the output drivers and applied to NAND gate 124, with NVM 1 and NVM2 being NOR'D at NOR gate 128 and inverted before being applied to 124. It will be appreciated that the write strobe WR is blocked if the appropriate memory space is not selected. It will also be appreciated that if both NVMs are selected simultaneously the write strobe will also be blocked.

A further protection feature is provided in the event that the NVM write strobe output is shorted "active". The address enable strobe at 20 is applied as the clock signal to a D flip-flop 130. If the NVMWR\ is shorted active, the ALE signal clocks the Q output low to block both of the NVM device selection signals at NAND gates 132 and 134.

Figure 8A:
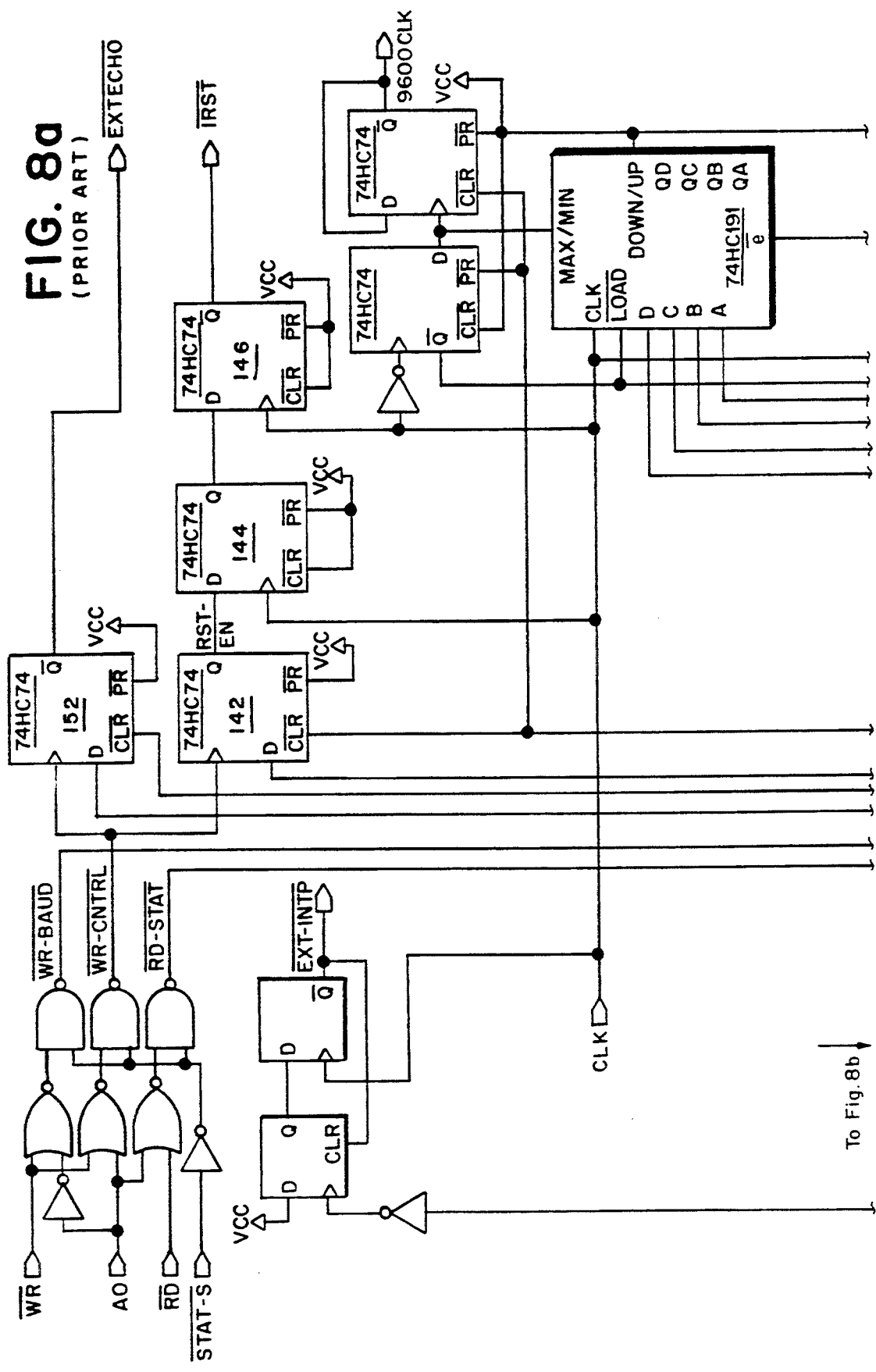
FIGS. 8(a)–8(b) are schematics of a status and control circuit arrangement.
Figure 8B:
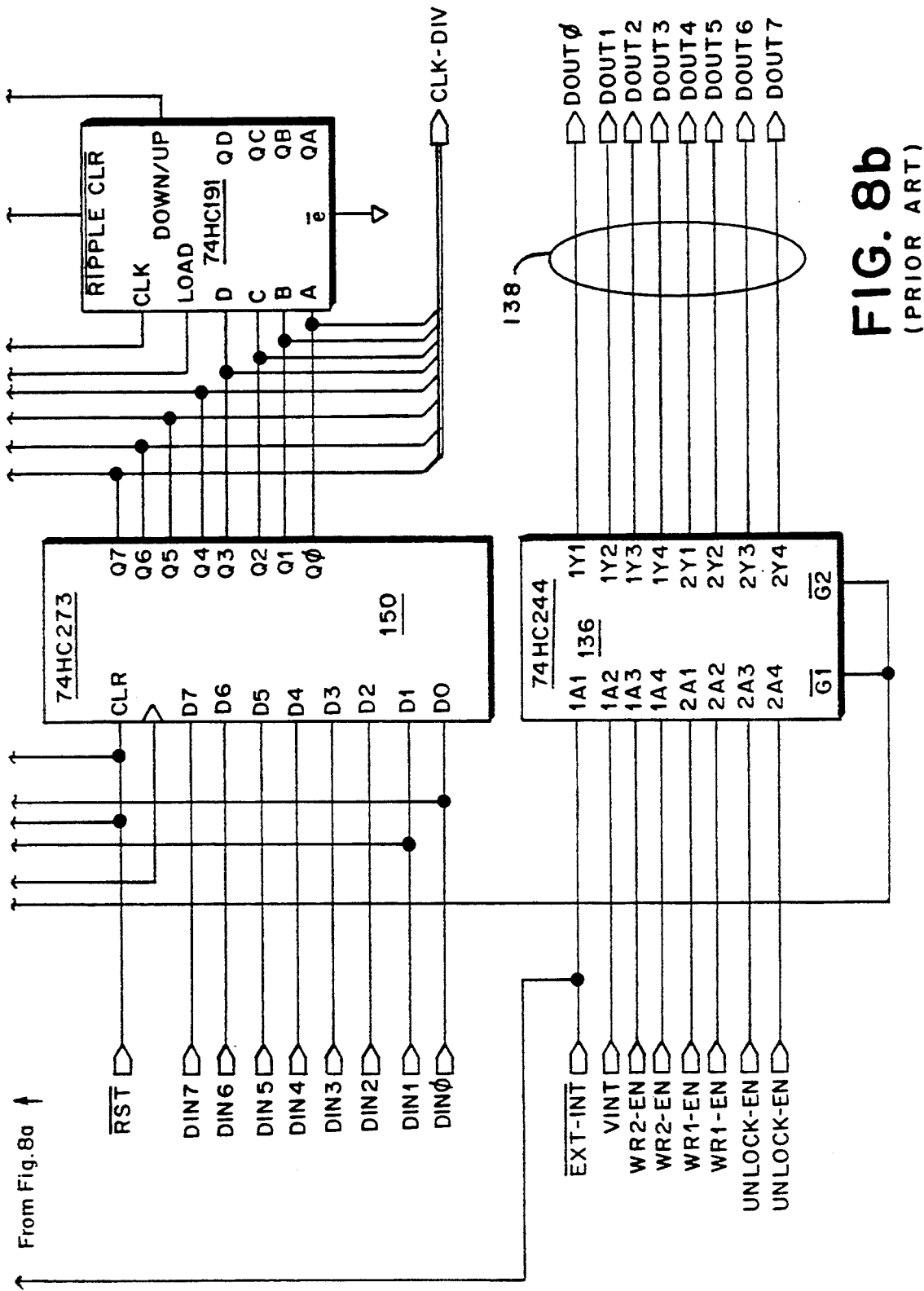
Figure 9A:
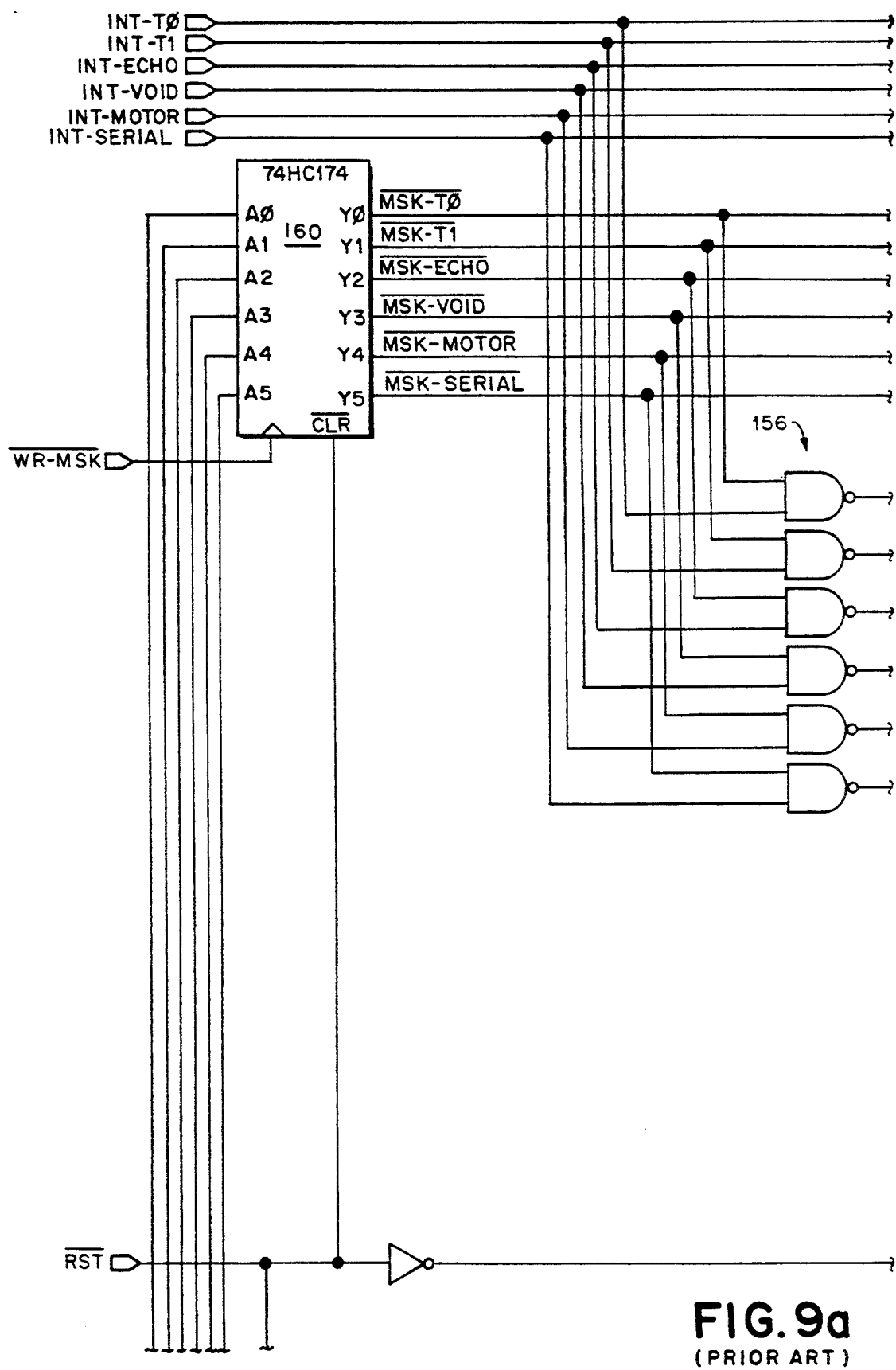
FIGS. 9(a)–9(f) are schematics of circuits for control of interrupts to the system microprocessor.
Figure 9B:
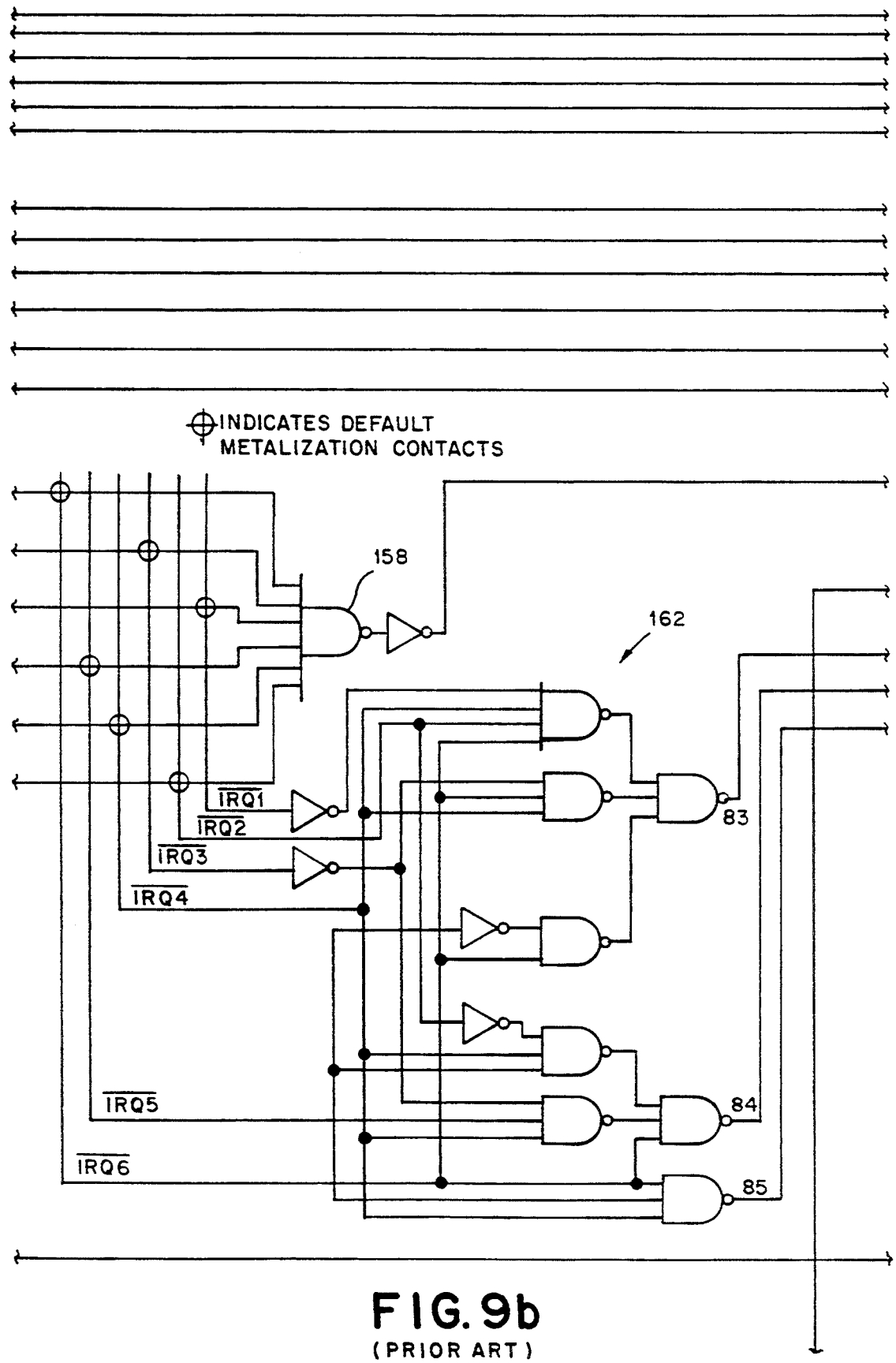
Figure 9C:
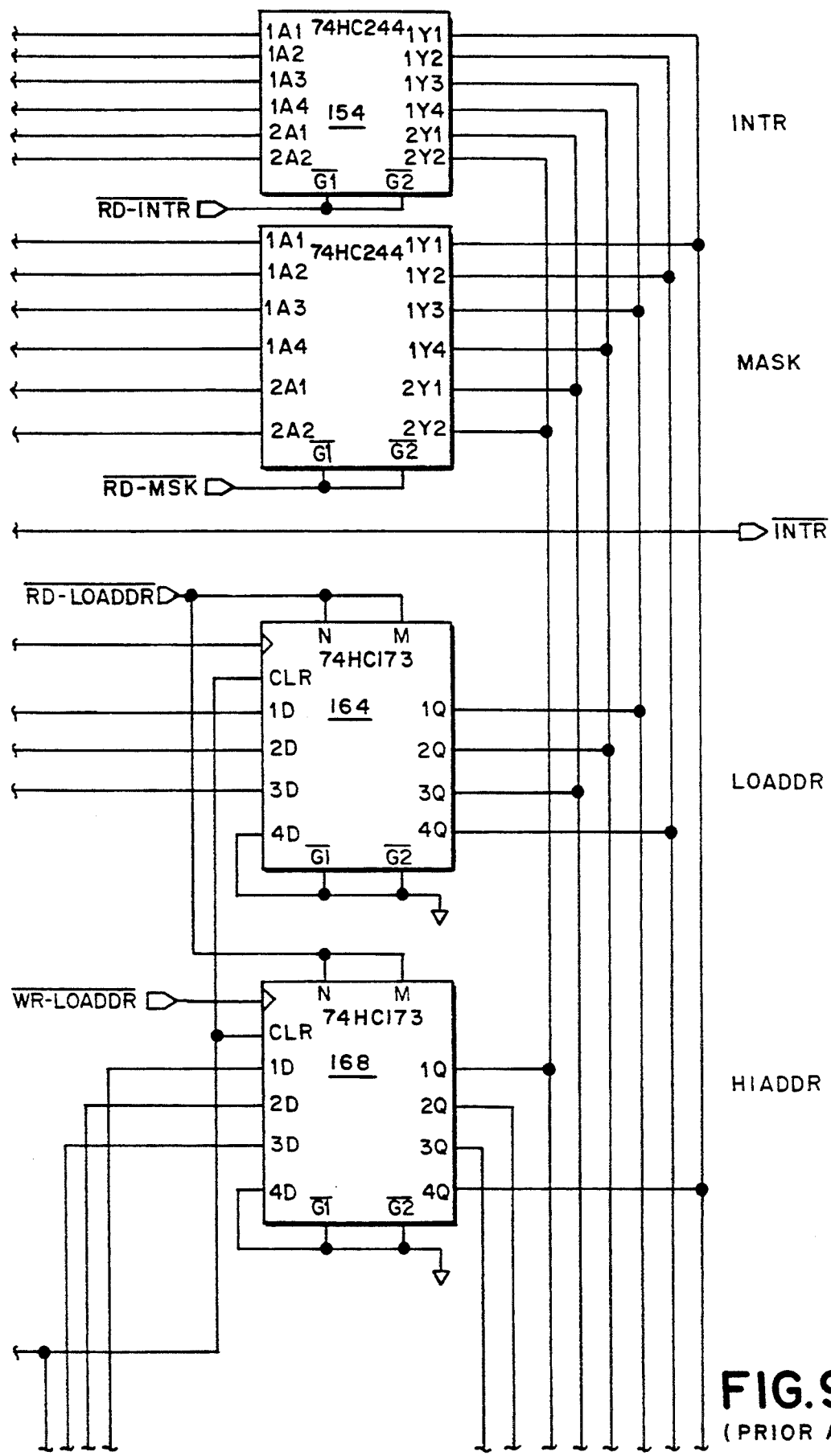
Figure 9D:
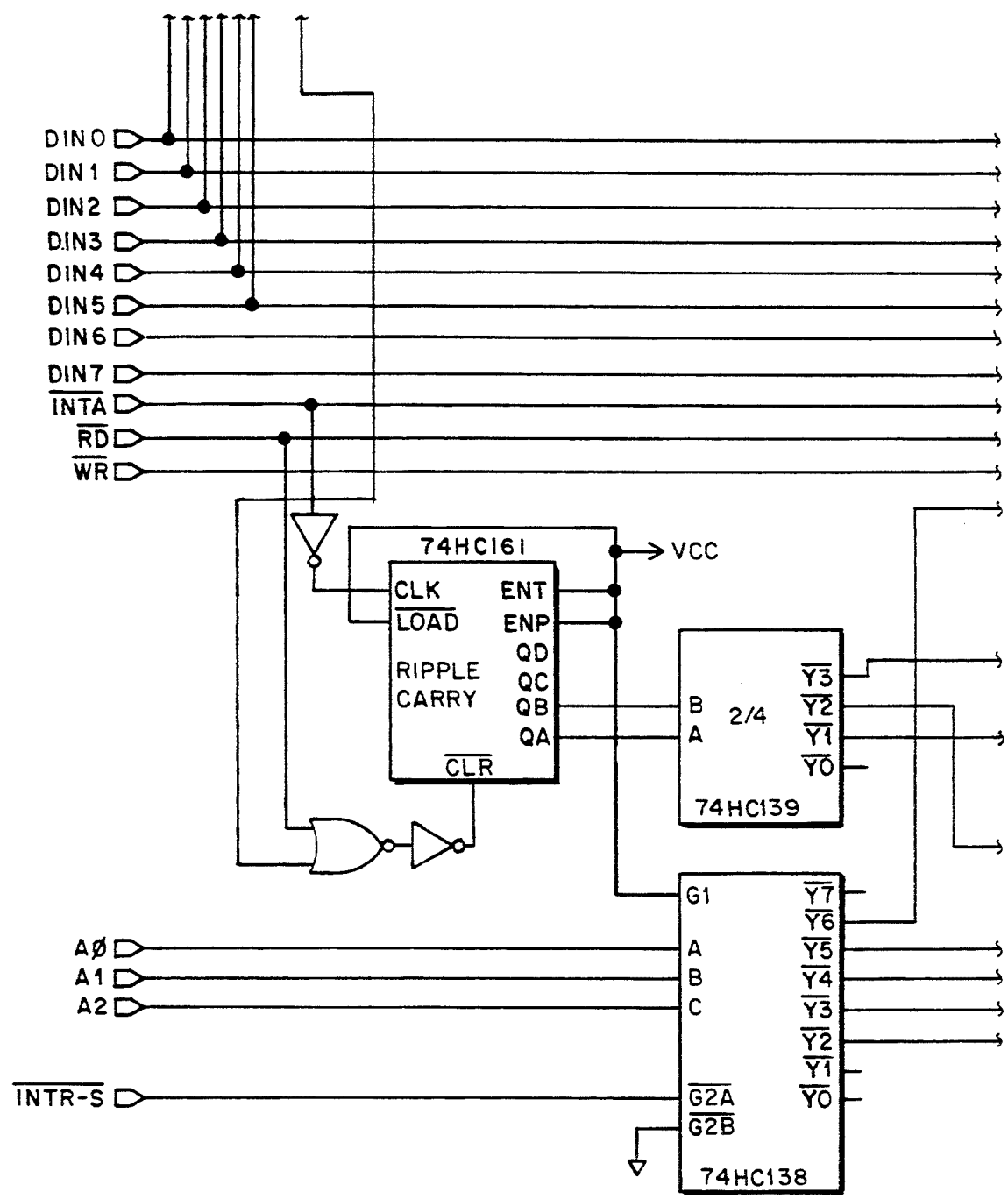
Figure 9E:
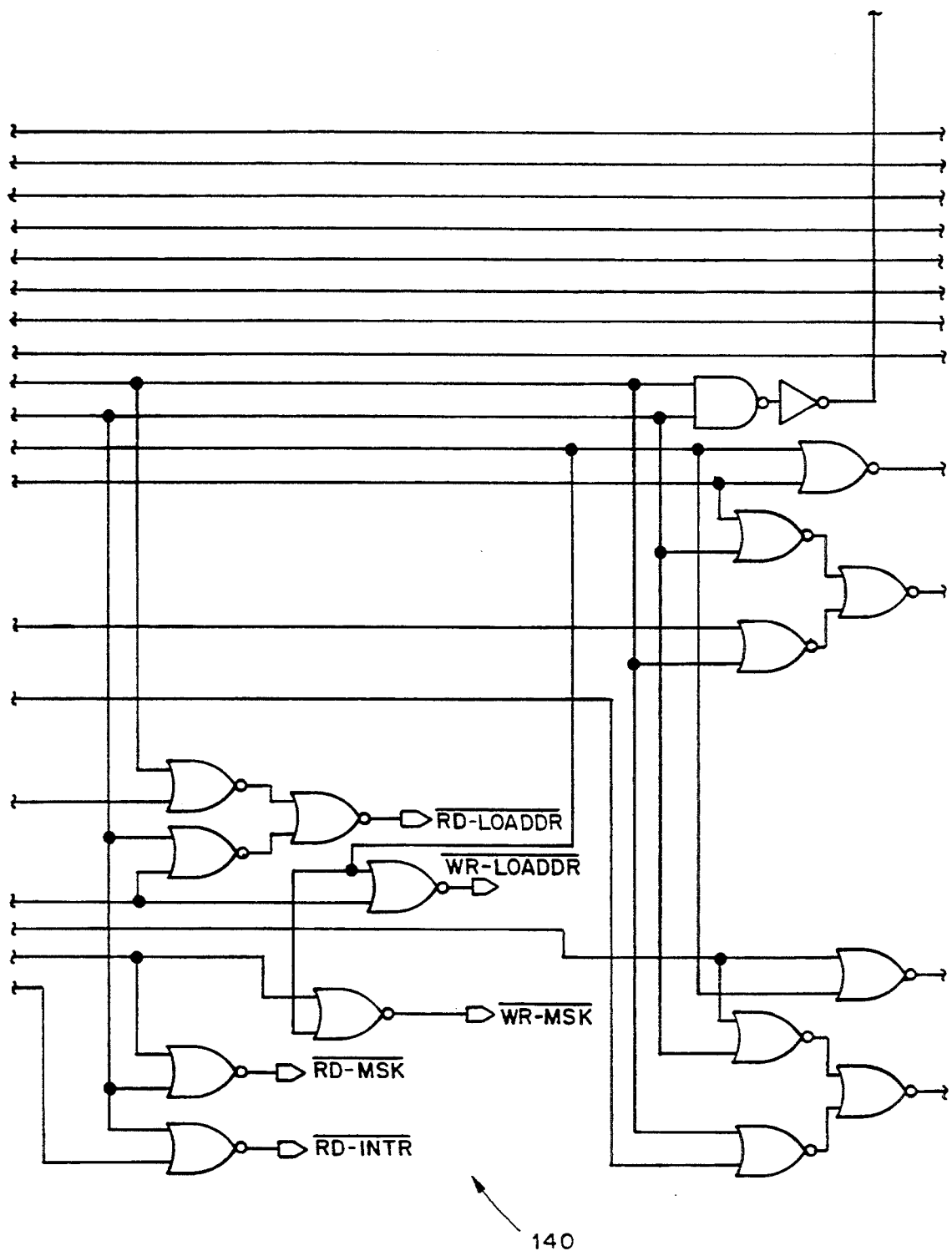
Figure 9F:
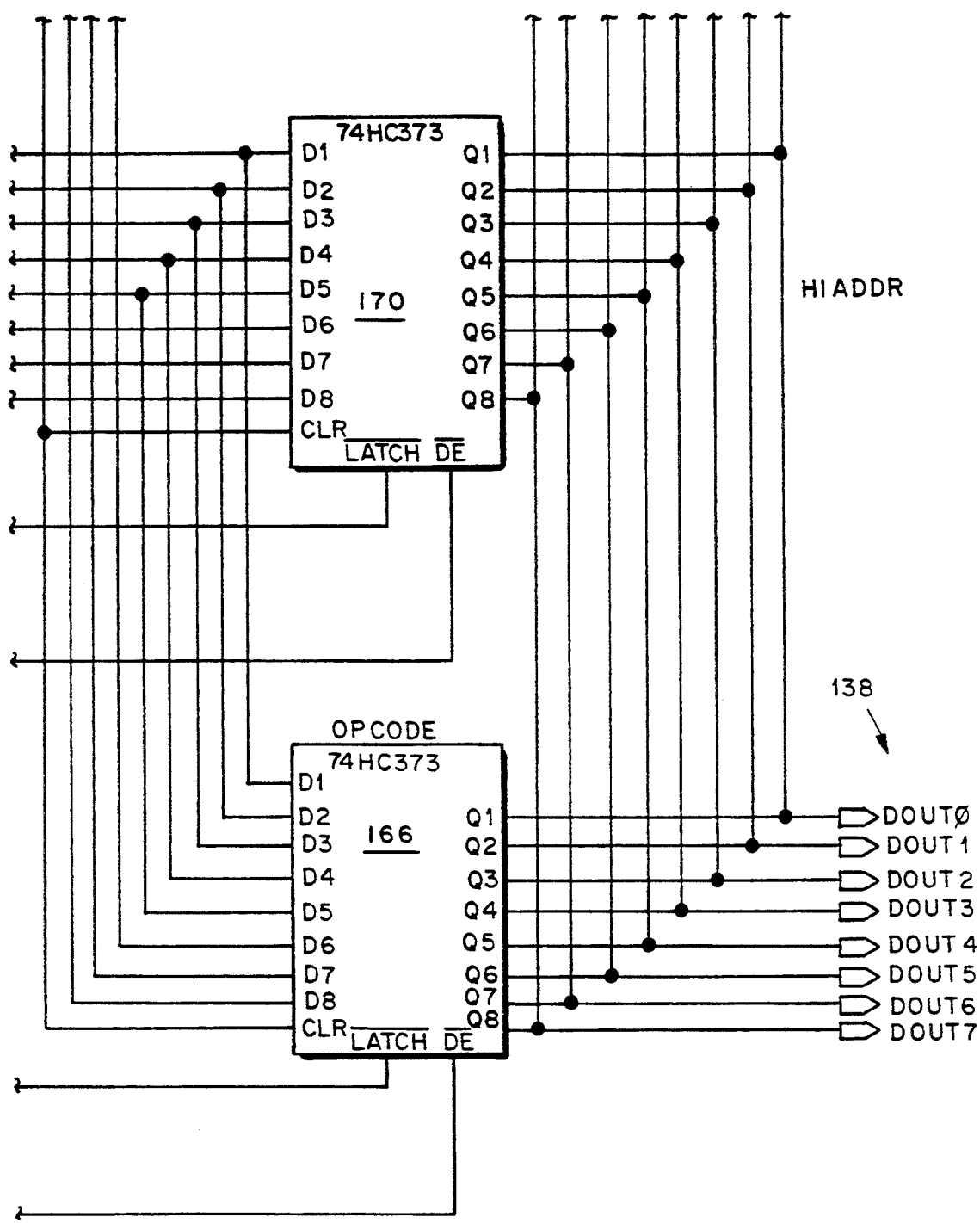

FIGS. 8(a)-8(b) are schematics of the status and control block. The block comprises a status port to allow monitoring of the control flip-flop outputs. The outputs of the control flip-flop block 32 are applied to buffer 136 for output to data bus 138, see also FIG. 2(a). The system clock input from 140 (see FIG. 2) is used in conventional fashion for timing the internal reset output by counting through D flip-flops 142, 144, and 146 to provide signal IRST which is the control signal for resetting all of the flip-flops in the circuit and is applied along with the System Reset to AND gate 148, (see FIG. 2).

The block select signal STAT-S\ for this block, the write strobe, read strobe, and lowest order address bit are decoded to clock the writing of data at octal flip-flop 150, for initiating a general decoder reset under the control of appropriate software commands and for setting a baud-rate divider circuit if desired. The EXTECHO\ signal from D flip-flop 152 is used as previously discussed for selection of an external communication device (not shown).

The Interrupt Controller block 50 is shown in more detail in FIGS. 9(a)-9(f). The interrupt controller in accordance with the invention provides great flexibility in the servicing of the various interrupt signals to the microprocessor. The signal INT-VOID from the illegal address control block 38, signals INT-TO and INT-TI generated by the time-out of timers in timer block 44, signal INT-ECHO from the ECHOPLEX block 42 which is "active" to indicate the start of an echoplex message, signal INT-SERIAL from serial I/O block 46 which is "active" when new data is received or when the port is read for sending data, and signal INT-MOTOR from PARALLEL I/O block 48 which is preferably "active" when an illegal motor control output has been communicated are each input to the INTERRUPT CONTROLLER block 50. The status of each of these signals may be read out directly from buffer 154 when the RD-INTR \ signal is "active".

Signal INTA \ from the system microprocessor is an interrupt acknowledge. It will be appreciated that if the INTA line is held or tied in the "inactive" state, each interrupt signal input applied through gates indicated generally at 156 and fed to NAND gate 158 will create an interrupt request signal INTR \ for communication to the system's microprocessor. Preferably, mask bits may be fed as data on data input bus 16 for providing masking bits to D-flip-flops 160 for latching. The latched outputs from 160 are applied to gates 156 so that the interrupt request will be generated whenever an unmasked device requests service. The particular device requesting service may be determined by reading the status buffer 154. The interrupt lines are also coded at the gates indicated generally at 162 for feeding to latch 164 which also provides similar information.

Preferably, as shown, there is also included a vectored interrupt for the handling of service requests. As discussed previously, a non-masked interrupt results in the generation of an interrupt-request signal to the systems microprocessor. For best results, the microprocessor upon receiving this signal will transmit an interrupt acknowledge signal INTA \ . This signal places the contents of the opcode latch 166 onto the data bus. In accordance with the invention, the processor interprets this data as an opcode, normally a call instruction for the microprocessor. Upon execution of the instruction, the microprocessor generates another INTA \ pulse to enable the lower vector latch 168. The encoding of bits on this latch as described above. The vector thus generated, desirably reflects a predetermined code representing the highest priority interrupt. The next INTA \ pulse, in response to the call of this OPCODE, will place the data residing in latch 170, preferably the upper vector address data, onto the data bus 138.

The INTR-S \ signal is utilized to select this block. The low order address signals A0 through A2 are used as illustrated to decode the various control signals on the gates indicated generally at 140.

Figure 11:
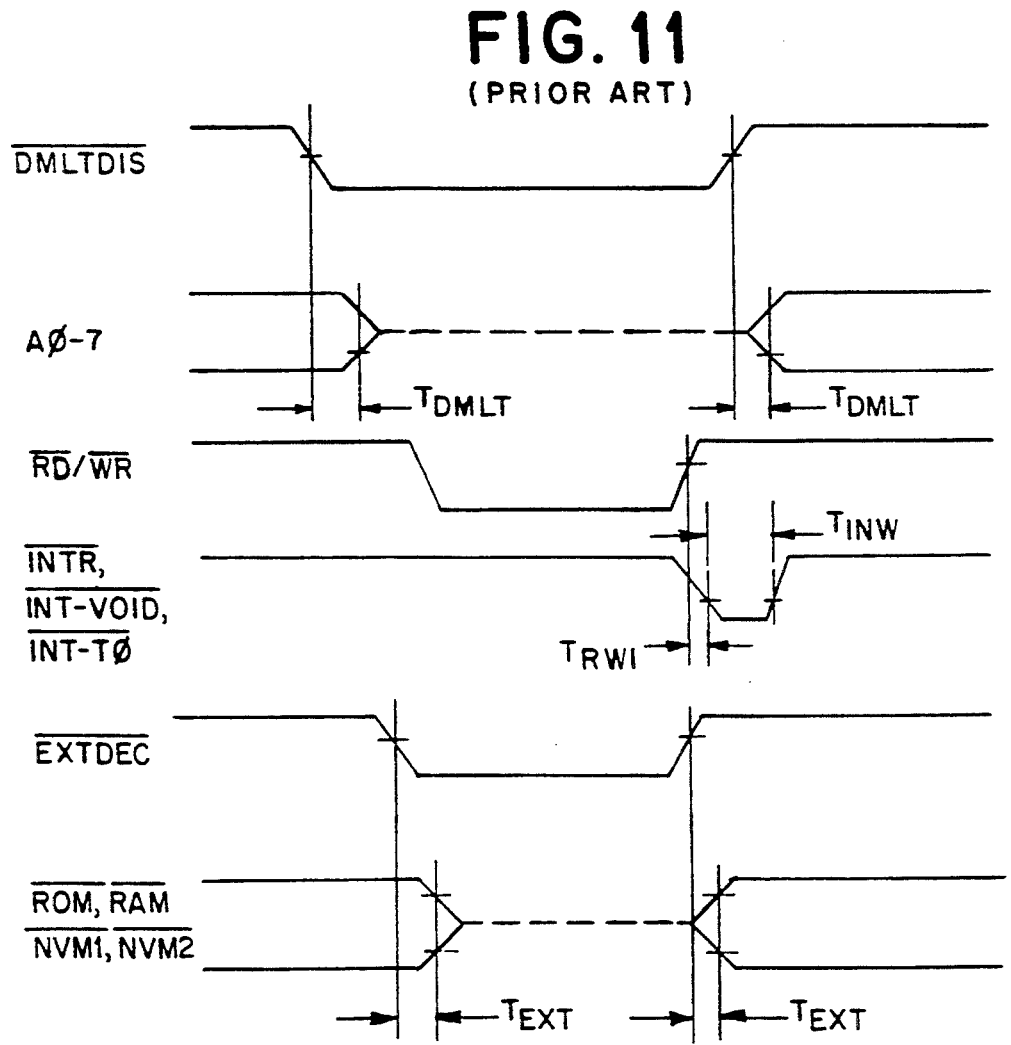
FIG. 11 is a timing diagram.
Figure 10:
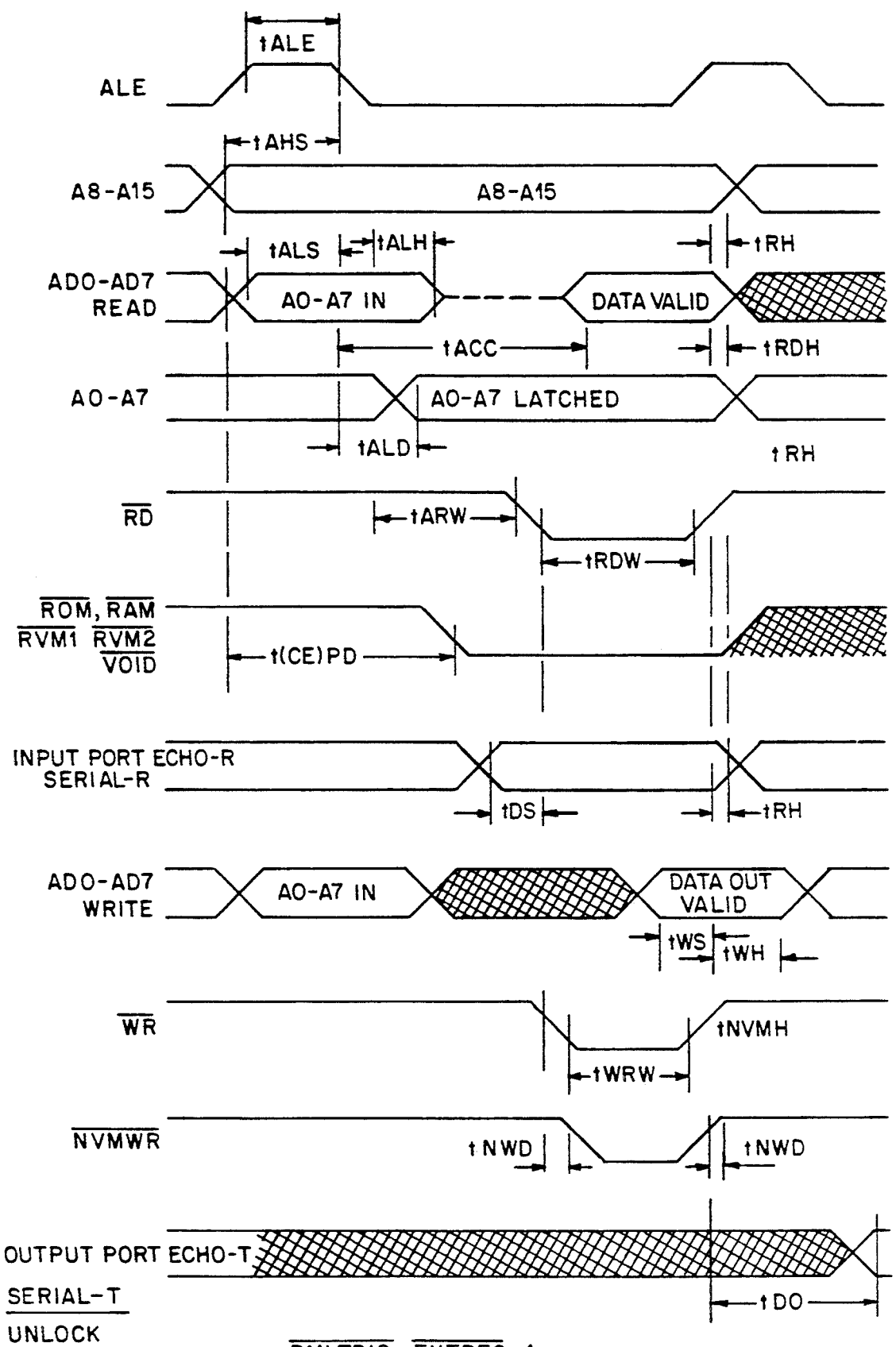
FIG. 10 is a timing diagram of the events.

Echoplex circuits suitable for use in block 42 are discussed in U.S. Pat. No. 4,301,507 incorporated by reference herein. Serial I/O and parallel I/O port circuits are well known and will not be discussed further herein. FIG. 10 and FIG. 11 are timing diagrams showing the interrelationship of signals previously discussed. The designated parameters and preferred timing are shown in TABLE III. It is believed that these diagrams will be readily understood by those skilled in the art so they will not be further described except with regard to the operation of the circuit.

TABLE III

| SYMBOL | PARAMETER | MIN | MAX | UNIT | NOTE |
|---|---|---|---|---|---|
| $t$ALE | ALE STROBE WIDTH | 75 | | ns | CONDITION |
| $t$AHS | AB-15 SET-UP TIME | 50 | | ns | CONDITION |
| $t$ALS | AD0-7 SET-UP TIME | 40 | | ns | CONDITION |
| $t$ALH | AD0-7 HOLD TIME | 30 | | ns | CONDITION |
| $t$ARW | ALE TO RD \ OR WR \ STROBE | 125 | | ns | CONDITION |
| $t$RDW | RD \ STROBE WIDTH | 225 | | ns | CONDITION |
| $t$WRW | WR \ STROBE WIDTH | 220 | | ns | CONDITION |
| $t$WS | WRITE DATA SET-UP TIME | 50 | | ns | CONDITION |
| $t$INW | INTERRUPT PULSE WIDTH | 125 | | ns | |
| $t$ACC | ALE TO VALID DATA | | 300 | ns | |
| $t$ALD | ALE TO VALID A0-7 | | 50 | ns | $t$ACCMAX −250ns |
| $t$(CE)PD | A8-15 TO: | | | | |
| | ROM \ ENABLE STROBE | | 50 | ns | $t$ACCMAX −250ns + $t$AHMIN |
| | RAM \ ENABLE STROBE | | 50 | ns | $t$ACCMAX −250ns + $t$AHMIN |
| | NVM1 \ ENABLE STROBE | | 60 | ns | $t$ACCMAX −250ns + $t$AHMIN |
| | NVM2 \ ENABLE STROBE | | 60 | ns | $t$ACCMAX −250ns + $t$AHMIN |
| | ECHO/VOID \ STROBE | | 70 | ns | $t$ACCMAX −250ns + $t$AHMIN |
| $t$DS | INPUT PORT DATA SET-UP TIME | 50 | | ns | |
| $t$WH | WRITE DATA HOLD TIME | 75 | | ns | |
| $t$NWD | WR \ TO NVMWR \ DELAY | | 35 | ns | $t$WHMIN − $t$NWDMAX |
| $t$NVMH | WRITE DATA HOLD TIME AFTER NVMWR \ | | 50 | ns | $t$WHMIN − $t$NWD |
| $t$DO | WR \ TO OUTPUT PORT DATA VALID | | 75 | ns | $t$WHMIN |
| $t$RH | A0-7 HOLD TIME AFTER RD \ | 0 | | ns | |
| $t$RDH | DATA HOLD TIME AFTER RD \ | 0 | 50 | ns | |
| $t$RWI | RD \ OR WR \ TO INTR | | 90 | ns | |
| $t$DMLT | DMLDIS \ TO A0-7 FLOAT | | 25 | ns | |
| $t$EXT | EXTDEC \ TO CE's FLOAT | | 25 | ns | |

The operation of the circuit has been particularly described with respect to each of the functional units. Broadly, however, the circuit 10 in accordance with the invention receives and decodes the periodic address signals communicated from the microprocessor and received at decoder block 28 and control flip-flop block 32. The address signals are decoded to provide an "active" selection signal for each of the various blocks of the circuit 10 and the memory devices of the electronic postage meter depending upon the communication of the appropriate addresses for the particular device. In the event, that an illegal address is communicated either because of a microprocessor or software failure or because of a failure in the instant circuit, the DVOID \ signal from the decoder block 28 goes "active" causing the output of gate 106 (FIG. 6) to go high and latching the Q output off flip-flop 108 active. Thus, a latched interrupt signal is sent to the interrupt control block 50 for communication to the microprocessor which responds as previously described above in conjunction with FIGS. 9(a)–9(f) whenever an illegal access is attempted.

As discussed previously, further protection is provided in the event that both non-volatile memories are selected. As seen in FIG. 7, if both the NVM1 \ and the NVM2 \ signals are active the output of gate 128 is high. This output is inverted and applied to gate 124 whose output is then held high so long as both devices are selected. The output of 124 is inverted and the low input to gate 126 blocks the microprocessor's write strobe WR to the NVM. It will also be appreciated that an additional interlock exists on the write access to each NVM by way of control flip-flops WR1-EN and WR2-EN. Under software control, write access is provided to NVM1 only when WR1-EN is set. Similarly, write access is provided to NVM2 only when WR2-EN is set.

Protection is also provided during system power up with the use of the unlock control flip-flop signal. It is a master control of access to the NVM's and postage printing which will disable these functions until the software operating system is ready to enable them.

In order to assure that signal NVMWR\ , the output from gate 126 is not shorted active and so to assure that writing to the NVM is being commanded by the microprocessor, the selection of a non-volatile memory is blocked if NVMWR \ is held active. The output write enable signal NVMWR \ is fed to latch 130 (FIG. 7) which is clocked by the address-latch-enable signal (ALE) from the microprocessor. The Q output from the latch which is normally high is used to enable gates 132 and 134.

If NVMWR \ is active when the ALE signal becomes active, the Q output of latch 130 goes high and blocks the output of gates 132 and 134. Thus, in order for a non-volatile memory to be selected there must be a periodically active non-volatile memory write enabling signal and selection of only one non-volatile memory to assure that the microprocessor is providing the appropriate data to the appropriately selected NVM.

Figure 12:
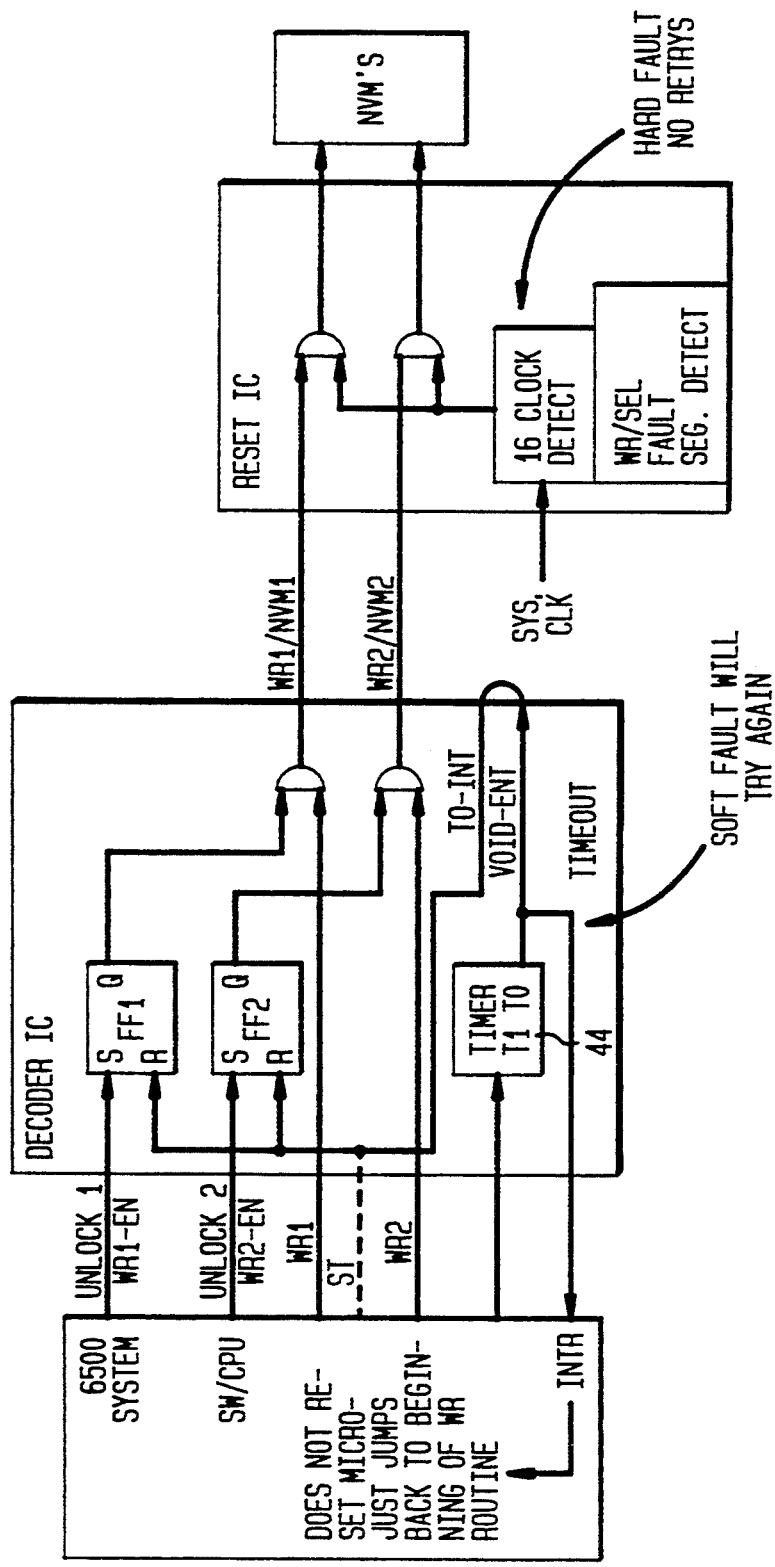
FIG. 12 is a schematic of the system write control.

Schematically shown in FIG. 12 is the CPU, Decoder IC, Reset IC and NVMs. As earlier noted, the VOID-INT pin of the Decoder IC is open drain. This pin may be connected to the TO-INT open drain pin of the Decoder IC. The TO-INT pin is connected to the internal interrupt pin of the CPU (refer to FIG. 1B). As now connected, when the microcontroller CPU enters the standard write routine, the dual timer 44 (also refer to FIG. 2C) is programmed to count the time that the write routine function should not exceed and then dual-timer 44 is activated. The write proceeds as afore described, however, the timer 44 is now in communication with the reset pin R of the flip-flops. Upon exiting the write routine, the dual-timer 44 is disabled and set to an inactive condition. If the write procedure is not completed within the time $T_o$ the timer 44 times out actuating the reset of the flip-flops and thereby locking the flip-flops. The output of the timer 44 upon time-out is also directed to the inter INTA/ of the CPU which upon receiving this interrupt enters a conventional write retry. In the preferred embodiment it is appreciated that the time $T_o$ is at less 50% less that the timer of the reset timer.

Alternatively, the pin VOID-INT may remain open. In this case, a conventional software timer may be employed. When a software timer is employed, as the software enters a write routine line ST goes active releasing the flip-flops 1 and 2, for the write procedure as afore described. If the write procedure is not completed within the allotted software time the software causes line ST to go active resetting the flip-flops and causing the software to enter a retry.

It will be understood that the claims are intended to cover all changes and modifications of the embodiment herein chosen for the purpose of illustration which do not constitute departures from the scope and spirit of the invention.

What is claimed is:

1. An improved postage meter having memory write access timed gate and a microprocessor for controlling a printing of value and for accounting such value printed, non-volatile memory for storage of accounting data representative of accounting, an decoder circuit having first addressable gating means for gating of a memory write enable signal from said microprocessor to said non-volatile memory, wherein said improvement comprises:
said microprocessor being programmed to execute a write cycle to said non-volatile memory by sequentially (i) issuing an enable write signal and an enabled write control signal, (ii) causing said accounting data to written to said non-volatile memory and (iii) disabling said write signal and said write control signal after completion of said writing of said accounting data to said non-volatile memory, said decoder circuit having a timer means in responsive communication with said microprocessor and gating means said gate means being in responsive communication with said timer means to place said gate means in an active mode, said gating means in said active mode having a first gating means for receiving said enable write signal from said microprocessor and responsively generating an enabled output signal and said gating means in said active mode having a second gating means for receiving said enabled write control signal and said enabled output signal and responsively generating an enabled memory select signal, said microprocessor being programmed to actuate said timer means upon initiation of execution of said write cycle, and deactuate said timer upon completion of said write cycle, said timer means being responsive to said initiation of execution of said write cycle to enable said timer to count an elapsed time of $T_0$, said microprocessor being programmed to re-execute said write cycle if said write cycle has not been completed by an elapsed time $T_1$ for enabling a latch output signal if said write cycle has not been completed within $T_0$ wherein $T_1$ is equal to or greater than twice $T_0$, means for directing said enabled latch output signal to said first gating means and latchably preventing said first gating means from outputting an enabled output signal thereby preventing any further write enabling of the first gate means.

* * * * *